United States Patent
Kouvetakis et al.

(10) Patent No.: US 8,545,627 B2
(45) Date of Patent: Oct. 1, 2013

(54) ZIRCONIUM AND HAFNIUM BORIDE ALLOY TEMPLATES ON SILICON FOR NITRIDE INTEGRATION APPLICATIONS

(75) Inventors: John Kouvetakis, Mesa, AZ (US); Radek Roucka, Tempe, AZ (US)

(73) Assignee: Arizona Board of Regents, Scottsdale, AZ (US), a body corporate of the State of Arizona, Acting for and on Behalf of Arizona State University ( * ) Notice: Subject to any disclaimer, the term of this patent is extended or adjusted under 35 U.S.C. 154(b) by 166 days.

(21) Appl. No.: 13/085,115

(22) Filed: Apr. 12, 2011

(65) Prior Publication Data

US 2011/0189838 A1 Aug. 4, 2011

Related U.S. Application Data

(62) Division of application No. 11/969,689, filed on Jan. 4, 2008.

(60) Provisional application No. 60/883,477, filed on Jan. 4, 2007, provisional application No. 60/973,002, filed on Sep. 17, 2007.

(51) Int. Cl.
*H01L 21/02* (2006.01)
*C04B 35/58* (2006.01)
*C30B 25/00* (2006.01)

(52) U.S. Cl.
USPC .......... 117/108; 257/190; 257/E21.125; 420/422; 420/528; 438/478; 438/938; 501/102

(58) Field of Classification Search
USPC ... 117/108; 257/190, E29.193, E21.123–125
See application file for complete search history.

(56) References Cited

U.S. PATENT DOCUMENTS

| | | | |
|---|---|---|---|
| 4,668,538 | A | 5/1987 | Feichtner et al. |
| 5,042,887 | A | 8/1991 | Yamada |
| 5,364,607 | A | 11/1994 | Tebbe et al. |
| 6,207,844 | B1 | 3/2001 | Kouvetakis et al. |
| 6,617,060 | B2 | 9/2003 | Weeks, Jr. |

(Continued)

FOREIGN PATENT DOCUMENTS

| EP | 1538243 | 6/2005 |
|---|---|---|
| WO | 2004/073045 | 8/2004 |

OTHER PUBLICATIONS

Aspnes, D.E., et al., "Dielectric functions and optical parameters of Si, Ge, GaP, GaAs, GaSb, InP, InAs, and InSb from 1.5 to 6.0 eV", The American Physical Society, Physical Review B, vol. 27, No. 2, Jan. 15, 1983, pp. 985-1009.

(Continued)

Primary Examiner — Ha Tran T Nguyen
Assistant Examiner — Raj R Gupta
(74) Attorney, Agent, or Firm — McDonnell Boehnen Hulbert & Berghoff LLP

(57) ABSTRACT

Semiconductor structures are provided comprising a substrate and a epitaxial layer formed over the substrate, wherein the epitaxial layer comprises B; and one or more element selected from the group consisting of Zr, Hf and Al and has a thickness greater than 50 nm. Further, methods for integrating Group III nitrides onto a substrate comprising, forming an epitaxial buffer layer of a diboride of Zr, Hf, Al, or mixtures thereof, over a substrate; and forming a Group III nitride layer over the buffer layer, are provided which serve to thermally decouple the buffer layer from the underlying substrate, thereby greatly reducing the strain induced in the semiconductor structures upon fabrication and/or operation.

18 Claims, 25 Drawing Sheets

(56) References Cited

U.S. PATENT DOCUMENTS

| | | |
|---|---|---|
| 7,297,989 B2 | 11/2007 | Otani et al. |
| 2002/0038892 A1 | 4/2002 | Otani et al. |
| 2003/0039866 A1 | 2/2003 | Mitamura et al. |
| 2005/0139960 A1 | 6/2005 | Shibata et al. |
| 2006/0060131 A1 | 3/2006 | Atanackovic et al. |
| 2006/0236923 A1 | 10/2006 | Kouvetakis et al. |
| 2008/0029773 A1 | 2/2008 | Jorgenson |
| 2008/0111195 A1 | 5/2008 | Atanackovic et al. |

OTHER PUBLICATIONS

Chirita, et al., "Elastic properties of nanocrystalline zirconium-silicon-boron thin films", Journal of Applied Physics, vol. 89, No. 8, Apr. 15, 2001, pp. 4349-4353.

Kinoshita, et al., "Zironium Diboride (0001) as an Electrically Conductive Lattice-Matched Substrate for Gallium Nitride", Jpn. J. Appl. Phys., vol. 40, 2001, pp. L1280-L1282.

Kato, et al., "Selective growth of wurzite GaN and Alx Ga1-xN on GaN/sapphire substrates by metalorganic vapor phase epitaxy", Journal of Crystal Growth, 144, 1994, pp. 133-140.

Lee, et al., "Growth of crack-free AlGaN film on high-temperature thin AlN interlayer", Journal of Crystal Growth, 234, 2002, pp. 305-310.

Linthicum, et al., "Pendeoepitaxy of gallium nitride thin films", Applied Physics Letters, vol. 75, No. 2, Jul. 12, 1999, pp. 196-198.

Liu, et al., "Atomic arrangement at the AlN/ZrB2 interface", Applied Physics Letters, vol. 81, No. 17, Oct. 21, 2002, pp. 3182-3184.

Molnar, et al., "Growth of gallium nitride by hydride vapor-phase epitaxy", Journal of Crystal Growth, 178, 1997, pp. 147-156.

Otani, et al., "Preparation of ZrB2 single crystals by the floating zone method", Journal of Crystal Growth, 165, 1996, pp. 319-322.

Porowski, S., "Bulk and homoepitaxial GaN-growth and characterization", Journal of Crystal Growth, 189, 1998, pp. 153-158.

Suda, et al., "Heteroepitaxial growth of group-III nitrides on lattice-matched metal boride ZrB2 (0001) by molecular beam epitaxy", Journal of Crystal Growth, 237-239, 2002, pp. 1114-1117.

Sung, et al., "Remote-plasma chemical vapor deposition of conformal ZrB2 films at low temperature: A promising diffusion barrier for ultralarge scale integrated eletronics", J. Appl. Phys., vol. 91, No. 6, Mar. 15, 2002, pp. 3904-3911.

Trampert, et al., "Direct observation of the initial nucleation and epitaxial growth of metastable cubic GaN on (001) GaAs", Applied Physics Letters, 70 (5), Feb. 3, 1997, pp. 583-585.

Tolle, et al., "Epitaxial growth of group III nitrides on silicon substrates via a reflective lattice-matched zirconium dibonde buffer layer", Applied Physics Letters, vol. 82, No. 15, Apr. 14, 2003, pp. 2398-2400.

Trivedi, et al., "Low-temperature GaN growth on silicon substrates by single gas-source epitaxy and photo-excitation", Applied Physics Letters, 87, No. 15, Apr. 14, 2003, pp. 2398-2400.

Tolle, et al., "Epitxial growth of AlxGa1-xN on Si(111) via a ZrB2(0001) buffer layer", Applied Physics Letters, vol. 84, No. 18, May 4, 2004, pp. 3510-3512.

Roucka, et al., "Epitaxial semimetallic HfxZr1-xB2 templates for optoelectronic integration on silicon", Applied Physics Letters, 89, 242110, 2006, pp. 242110-1-242110-3.

Kinoshita, et al., "ZrB2 Substrate for Nitride Semiconductors", Jpn. J. Appl. Phys., vol. 42, 2003, pp. 2260-2264.

Kamiyama, et al., "Violet and UV light-emitting diodes grown on ZrB2 substrate", Phys. Stat. Sol. (a) 200, No. 1, 2003, pp. 67-70.

Liu, et al., "First-principles studies of GaN(0001) heteroepitaxy on ZrB2(0001)", Physical Review B 72, 2005, pp. 245335-1-245335-7.

Takamura, et al., "Surface and Interface Studies of GaN Epitaxy on Si(111) via ZrB2 Buffer Layers", Physical Review Letters 95, Dec. 31, 2005, pp. 266105-1-266105-4.

Roucka, R., "Epitaxial Growth of Novel Wide Bandgap Semiconductors and Metallic Diborides on Silicon", Arizona State University Thesis, Aug. 2004.

Roucka, et al., "Epitaxial film growth of zirconium diboride on Si(001)", Journal of Crystal Growth, 277, 2005, pp. 364-3714.

Maeda, et al. (2001) Phys. Stat. Sol. (a) 188(1): 223-226.

Makimoto, et al. (2001) Phys. Stats. Sol. (a) 188(1):183-186.

Kuramata, et al. (1998) J. Crystal Growth 189/190: 826-830.

Mukai, et al. (1998) J. Crystal Growth 189/190: 778-781.

Nakamura et al. (1998) J. Crystal Growth 189/190: 841-845.

Okamoto, et al. (2003) J. Appl. Phys 93: 88.

Hu et al. (2004) J. Cryst Growth 267(3-4): 554-563.

Kim, et al., Phys. Rev. Lett. 87 (8): 087002 (2001).

Masui, et el., Phys. Rev. B 65 (21): 214513 (2002).

Jayaraman et al., Surf. Coat. Tech. 200(22-23): 6629 (2006).

Armitage, et al. (2005) Phys. Status Solid. C 2(7): 2191.

Oda et al., (2003) UVSOR Act. Rep. 2002:156.

Yanson et al., (2003) Modern Phys. Lett. B 17(10-12):657.

Rouka et al., Epitaxial semimetallic HfxZr1-xB2 templates for optoelectronic integration on silicon. Appl. Phys. Lett. 89, 242110 (2006).

(a)

(b)

ZIRCONIUM AND HAFNIUM BORIDE ALLOY TEMPLATES ON SILICON FOR NITRIDE INTEGRATION APPLICATIONS

CROSS-REFERENCE TO RELATED APPLICATIONS

This application is a divisional application of U.S. patent application Ser. No. 11/969,689, filed Jan. 4, 2008, and further claims the benefit of the filing dates, under 35 USC §119(e), of U.S. Provisional Application Ser. No. 60/883,477, filed Jan. 4, 2007; and U.S. Provisional Application Ser. No. 60/973,002, filed Sep. 17, 2007, each of which are hereby incorporated by reference in their entirety.

STATEMENT OF GOVERNMENT FUNDING

The invention described herein was made in part with government support under grant number EEC-0438400, awarded by the National Science Foundation. The United States Government has certain rights in the invention.

FIELD OF THE INVENTION

The invention generally relates to the preparation and use of epitaxial buffer layers in the preparation of Group III-N materials on solid supports. In particular, the invention relates to the use of epitaxial diboride buffer layers on semiconductor substrates for use in the preparation of Group III-N overlayers.

BACKGROUND OF THE INVENTION

Group III nitride materials include gallium nitride (GaN), aluminum nitride (AlN), indium nitride (InN) and their alloys such as aluminum gallium nitride (AlGaN), indium gallium nitride (InGaN), and aluminum indium gallium nitride (AlInGaN). These materials are semiconductor compounds that have a wide direct bandgap, which permits highly energetic electronic transitions to occur. Such electronic transitions can result in group III nitride materials having a number of attractive properties including the ability to efficiently emit blue and ultraviolet light, the ability to transmit signals at high frequency, and others. Accordingly, group III nitride materials are being widely investigated in many semiconductor device applications, including microelectronic devices such as transistors, and optoelectronic devices such as laser diodes and light emitting diodes (LEDs).

Group III nitride materials have been formed on a number of different substrates including sapphire, silicon (Si), and silicon carbide (SiC). Semiconductor structures, such as doped regions, may then be formed within the group III nitride material region. There are many advantages of growing group III nitrides, such as GaN, on Si substrates, an important one of which is the integration with Si-based electronics and the availability of very large area substrates. Previously, however, semiconductor structures having group III nitrides formed on Si substrates have presented significant drawbacks. Such structures have been complicated and expensive to fabricate. Moreover, light emitting optoelectronic devices having group III nitrides formed on silicon substrates are less efficient than such devices formed on sapphire substrates. In optoelectronic applications, Si is approximately 45% absorbing in the ultraviolet (UV) region, while sapphire is totally transparent (see, Aspnes, et al. *Phys. Rev. B* 27, 985 (1983)). Thus, a light-emitting optoelectronic device based on group III nitrides will be less efficient if Si(111) is used as a substrate than if sapphire is used as a substrate.

The growth of group III nitrides, including GaN, is most commonly accomplished by heteroepitaxy using methods of metal organic chemical vapor deposition (MOCVD) and molecular beam epitaxy (MBE). The substrates employed are generally sapphire and α-SiC(0001), which have lattice mismatches of 16% and 3.6% respectively with GaN. Coupled with mismatches in thermal expansion coefficients, the misfit dislocations produced in GaN during heteroepitaxial growth pose a limitation to the ultimate performance of nitride-based electronics. Various growth schemes involving patterned substrates have been developed to improve the dislocation density. These growth schemes include, for example, epitaxy by lateral overgrowth (ELOG), which is described in Kato, et al. *J. Cryst. Growth* 144, 133 (1994), and pendeoepitaxy (PE), which is described in Linthicum et al, *Appl. Phys. Lett.* 75, 196 (1999). Nevertheless, the quest for lattice-matched substrates continues. Bulk GaN crystals grown under high pressures, as described by Porowski, *J. Cryst. Growth* 189/190, 153 (1998), have been used as substrates. Such substrates, however, are hampered by their small size. Another approach to homoepitaxy is the growth of thick GaN layers by hydride vapor phase epitaxy (HVPE), which is described by Molnar, et al., *J. Cryst. Growth* 178, 147 (1997). These substrates, however, suffer from poor crystallinity and the highly strained layers often develop cracks and other undesirable morphologies.

Kinoshita et al. *Jpn. J. Appl. Phys., pt.* 2, 40, L1280 (2001) have reported the growth of single crystals of zirconium diboride, $ZrB_2$(0001) to provide an electrically conductive lattice-matched substrate for GaN growth. $ZrB_2$ has a hexagonal structure with lattice constants a=3.169 Å and c=3.530 Å. The in-plane lattice constant has about 0.6% mismatch with that of GaN (a=3.189 Å). The thermal expansion coefficients along [1010] on the basal plane are also well-matched between $ZrB_2$ and GaN, being $5.9 \times 10^{-6}$ $K^{-1}$ and $5.6 \times 10^{-6}$ $K^{-1}$ respectively. While these similarities in thermal properties between $ZrB_2$ and GaN suggest that the use of $ZrB_2$ (0001) as a substrate for the growth of GaN films may lead to a reduction of both dislocation density and biaxial strain in the GaN, significant drawbacks still limit the use of $ZrB_2$ as a substrate for the growth of GaN films. One such drawback is the high temperature required to prepare single crystals of $ZrB_2$. Preparation of these crystals requires very high temperatures since the melting point of $ZrB_2$ is 3220° C. A float-zone method has been developed, as described by Otani, et al., *J. Cryst. Growth* 165, 319 (1996), in which a 1-cm diameter rod was isostatically pressed at 1700° C. from $ZrB_2$ powder and melted in a floating zone by radio frequency (RF) heating. The molten zone was about 0.5 cm long and a growth rate of 2-3 cm per hour was obtained, as described by Otani et al. and Kinoshita et al. The $ZrB_2$ single crystals thus grown, however, have size limitations.

A typical size of such a crystal of $ZrB_2$ is 1 cm in diameter and 6 cm long. Successful epitaxial and strain-free GaN and AlN growth on such single crystals of $ZrB_2$ using MBE and MOCVD, respectively, have been reported, respectively by Suda et al., *J. Cryst. Growth* 237-239, 1114 (2002) and Liu et al., *Appl. Phys. Lett.* 81, 3182 (2002). However, the size limitation of the $ZrB_2$ substrate remains an unresolved issue.

SUMMARY OF THE INVENTION

In a first aspect, the invention provides a semiconductor structure comprising a substrate and an epitaxial layer formed over the substrate, wherein the epitaxial layer comprises B (boron) and one or more element selected from the group consisting of Zr, Hf and Al; and the epitaxial layer has a thickness greater than 50 nm.

In a second aspect, the invention provides methods for forming an epitaxial buffer layer over a substrate comprising, contacting a substrate with a precursor gas at a temperature and a pressure suitable for depositing an epitaxial buffer layer over the substrate, the epitaxial buffer layer having a thickness of greater than about 50 nm, wherein the precursor gas comprises (i) about 0.1-5 v/v % $Zr(BH_4)_4$, $Hf(BH_4)_4$, an Al source, or mixtures thereof; and (ii) hydrogen.

In a third aspect, the invention provides a method for integrating Group III nitrides onto a substrate comprising, forming a buffer layer of a diboride of Zr, Hf, Al, or mixtures thereof, having a thickness greater than about 50 nm over a substrate; and forming a Group III nitride layer over the buffer layer.

In a fourth aspect, the invention provides a method for forming an $Al_xGa_{1-x}N$ layer over a substrate comprising, contacting a substrate with $H_2GaN_3$, $D_2GaN_3$, or mixtures thereof in the presence of an Al source at a temperature and a pressure to form a $Al_xGa_{1-x}N$ layer, wherein the temperature is less than about 800° C.

In a fifth aspect, the invention provides a method for tuning the reflectivity of a buffer layer comprising, forming a buffer layer of an alloy of the formula $Hf_xZr_{1-x}B_2$ having a thickness greater than about 50 nm and a reflectivity over a substrate, wherein x is a predetermined value from 0 to 1, and wherein the reflectivity of the buffer layer is greater than a layer of $ZrB_2$ having an similar thickness as the buffer layer.

In a sixth aspect, the invention provides a method for tuning the lattice constant of a buffer layer comprising, forming a buffer layer of an alloy of the formula $Hf_xZr_{1-x}B_2$ having a thickness greater than 50 nm, and forming an active layer over the buffer layer, wherein x is a predetermined value from 0 to 1, and wherein the active layer is lattice matched to the buffer layer.

In a seventh aspect, the invention provides a semiconductor structure comprising, a stack comprising a plurality of repeating alloy layers, formed over a substrate, wherein the repeating alloy layers comprise two or more alloy layer types, wherein at least one alloy layer type comprises a $Zr_zHf_yAl_{1-z-y}B_2$, alloy layer, wherein the sum of z and y is less than or equal to 1, and the thickness of the stack is greater than about 50 nm.

BRIEF DESCRIPTION OF THE DRAWINGS

FIG. 9(a) shows the electronic band structure of $ZrB_2$ (the horizontal lines denotes the Fermi level).

FIG. 9(c) is a "roadmap" of the Brillouin zone used in the band structure plot.

FIG. 9(d) illustrates the crystal structure of $ZrB_2$ (Zr atoms blue, B atoms pink).

FIG. 15 (b) shows an X-ray diffraction (XRD) (113) reciprocal space map from $Zr_{0.70}Hf_{0.30}B_2$/Si(111);

FIG. 15 (c) shows a diffraction contrast micrograph of entire layer showing defect free microstructure and smooth surface. The inset shows a high resolution image of the perfectly epitaxial interface;

FIG. 16 (b) shows high resolution X-ray reciprocal space maps of the (−113) peaks of $Hf_{0.5}Zr_{0.5}B_2$ and $ZrB_2$ buffer layer;

FIG. 24 (b) shows a typical cathodoluminescence spectrum from the sample of FIG. 24(a) exhibiting strong band gap emission peaks with a wavelength maximum at 346 nm which corresponds to a composition of $Al_{0.10}Ga_{0.90}N$;

DETAILED DESCRIPTION OF THE INVENTION

In a first aspect, the invention provides a semiconductor structure comprising a substrate and an epitaxial layer comprising B and one or more elements selected from the group consisting of Zr, Hf, and Al, formed by epitaxy formed over the substrate, wherein the epitaxial layer has a thickness greater than 50 nm.

The semiconductor structures of the present invention can be used, for example, to help support the growth of group III nitride materials on a substrate. In one non-limiting example, the epitaxial layer can serve as a buffer layer for growth of group III nitride materials on a substrate, for example, where the buffer layer is thermally decoupled (not thermally pinned) to the underlying substrate. Such buffer layers have the advantage of reducing the strain imposed on the semiconductor structure by the thermal cycling involved in semiconductor process and operation. Such resulting semiconductor structures having group III nitride materials can be used for active semiconductor devices, such as transistors, field emitters, light-emitting optoelectronic devices, and optoelectronic devices.

Figure 1:
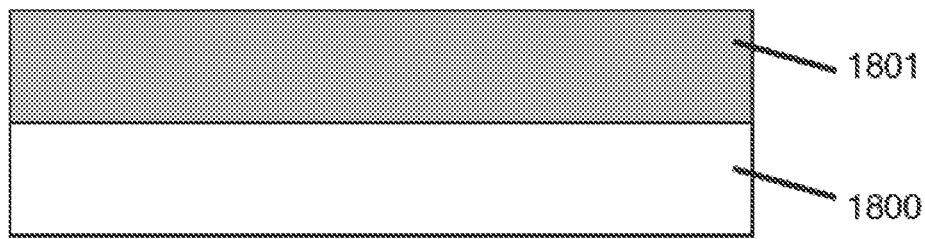
FIG. 1 illustrates an exemplary semiconductor structure of the invention comprising a substrate and a layer of the invention, as described herein, formed over the substrate.

Referring to FIG. 1, according to a first aspect of the invention, a semiconductor structure is provided comprising a substrate (1800) and an epitaxial layer (1801) formed over the substrate. Such layers (1801) may be discontinuous (e.g., islands or quantum dots) or continuous as illustrated in FIG. 1.

The epitaxial layer generally has a thickness of greater than 50 nm. Such thicknesses for the epitaxial layer may be prepared according to the methods of the present disclosure (infra). For example, it has been found that such layers may be formed over a substrate from a precursor gas comprising an excess of hydrogen and a Zr, Hf, and/or Al source.

In some embodiments, the epitaxial layer may have a thickness of greater than about 100 nm, and preferably, greater than about 200 nm. Such thicknesses for the epitaxial layer have been unexpectedly found to be thermally decoupled from (i.e., not thermally pinned by) the underlying substrate. In contrast with epitaxial layers with thicknesses of 200 nm or less, the underlying substrate does not control the thermal properties (e.g., coefficient of thermal expansion) of the overlying epitaxial layer; rather, the epitaxial layer of the invention has thermal properties, and particularly its coefficient of thermal expansion, which are essentially similar to the bulk.

As used herein, the epitaxial layer may have a thickness of 50 nm to 2 μm or 100 nm to 2 μm. In various further embodiments, the epitaxial layer may have a thickness of 250 nm to 1.5 μm; 300 nm to 1.25 μm; 350 nm to 1.25 μm; 400 nm to 1.25 μm; or 400 nm to 1 μm. In various further embodiments of the first aspect, the epitaxial layer may have a thickness greater than 250 nm; 300 nm, 350 nm, or 400 nm. The epitaxial layers of the invention may have any maximal thickness suitable for a given purpose. In one embodiment, the epitaxial layer may have a thickness of less than 2-3 μm; in further embodiments, the epitaxial layer may have a thickness of less than 1.5 μm or 1 μm.

In one embodiment of the first aspect, the epitaxial layer is formed directly on the substrate.

In another embodiment of the first aspect, the epitaxial layer has a thickness of greater than about 200 nm and has one or more of the properties of: (i) relaxed at 900° C.; (ii) not thermally pinned to the substrate; (iii) a mismatch strain which is essentially thermally constant over a temperature range of room temperature to 900° C.; and (iv) an atomically flat surface.

In particular, the epitaxial layer formed over the substrate generally has an atomically flat surface over an area greater than about 50 μm². Often, the epitaxial layer has an atomically flat surface over an area greater than about 100 μm². In a preferred embodiment, the epitaxial layer has an atomically flat surface over an area greater than about 250 μm², or 500 μm² or 1 mm². The extent of the atomically flat nature of an epitaxial layer surface can be readily determined by one skilled in the art by utilizing atomic force microscopy and XTEM techniques. Standard optical microscopy must be use to show the absence of large islands or other imperfection in between the flat areas on the wafer surface.

In any of the preceding embodiments of the first aspect, the epitaxial layer may comprise B and one or more elements selected from the group consisting of Zr, Hf and Al. In various embodiments, the epitaxial layer comprises one of $ZrB_2$, $AlB_2$, $HfB_2$, $Hf_xZr_{1-x}B_2$, $Hf_xAl_{1-x}B_2$, $Zr_xAl_{1-x}B_2$, or $Zr_xHf_yAl_{1-x-y}B_2$, wherein the sum of x and y is less than or equal to 1. In various further embodiments, the epitaxial layer comprises $ZrB_2$, $HfB_2$, $Hf_xZr_{1-x}B_2$, or $Zr_xHf_yAl_{1-x-y}B_2$, wherein the sum of x and y is less than or equal to 1. In a further embodiment, the epitaxial layer comprises $ZrB_2$.

In any of the preceding embodiments of the first aspect, the epitaxial layer is formed directly on the substrate and comprises $ZrB_2$, $Hf_xZr_{1-x}B_2$, $Zr_xAl_{1-x}B_2$, or $Zr_xHf_yAl_{1-x-y}B_2$, wherein the sum of x and y is less than or equal to 1. In various further embodiments, the epitaxial layer is formed directly on the substrate and comprises $ZrB_2$ or $Hf_xZr_{1-x}B_2$. In a further embodiment, the epitaxial layer is formed directly on the substrate and comprises $ZrB_2$. The epitaxial layer may comprise two or more epitaxial sublayers. For example, the epitaxial layer may comprise two epitaxial sublayers, where the first epitaxial sublayer is formed directly on the second epitaxial sublayer. Each of the epitaxial sublayers may comprise an alloy of B and one or more element selected from the group consisting of Zr, Hf and Al. In various embodiments, the epitaxial sublayers independently comprise an alloy of $ZrB_2$, $AlB_2$, $HfB_2$, $Hf_xZr_{1-x}B_2$, $Hf_xAl_{1-x}B_2$, $Zr_xAl_{1-x}B_2$, or $Zr_xHf_yAl_{1-x-y}B_2$, wherein the sum of x and y is less than or equal to 1. In various further embodiments, the epitaxial sublayer comprises $ZrB_2$, $HfB_2$, $Hf_xZr_{1-x}B_2$, or $Zr_xHf_yAl_{1-x-y}B_2$, wherein the sum of x and y is less than or equal to 1.

In some embodiments, the first epitaxial sublayer is formed directly on the substrate and comprises an alloy of $ZrB_2$, $Hf_xZr_{1-x}B_2$, $Zr_xAl_{1-x}B_2$, or $Zr_xHf_yAl_{1-x-y}B_2$, wherein the sum of x and y is less than or equal to 1. In this embodiment, the second epitaxial sublayer may comprise an alloy of $ZrB_2$, $AlB_2$, $HfB_2$, $Hf_xZr_{1-x}B_2$, $Hf_xAl_{1-x}B_2$, $Zr_xAl_{1-x}B_2$, or $Zr_xHf_yAl_{1-x-y}B_2$, wherein the sum of x and y is less than or equal to 1. In another particular embodiment, the first epitaxial sublayer is formed directly on the substrate and comprises an alloy of $ZrB_2$, $Hf_xZr_{1-x}B_2$, $Zr_xAl_{1-x}B_2$, or $Zr_xHf_yAl_{1-x-y}B_2$, wherein the sum of x and y is less than or equal to 1 and the second sublayer comprises $HfB_2$. In one particular embodiment, the first epitaxial sublayer is formed directly on the substrate and comprises $ZrB_2$ or $Hf_xZr_{1-x}B_2$, and the second epitaxial sublayer comprises $HfB_2$.

In any of the embodiments where the epitaxial layer comprises two or more epitaxial sublayers, the epitaxial layer has a thickness of greater than 50 nm, 100 nm, 150 nm, 200 nm, 250 nm, 300 nm, 350 nm, or 400 nm. In another embodiment where the epitaxial layer comprises two or more epitaxial sublayers, at least one of the epitaxial sublayers has a thickness of greater than 50 nm. As used herein, the epitaxial layer may have a thickness of 50 nm to 2 μm, 100 nm to 2 μm, 250 nm to 1.5 μm; 300 nm to 1.25 μm; 350 nm to 1.25 μm; 400 nm to 1.25 μm; or 400 nm to 1 μm.

Figure 2:
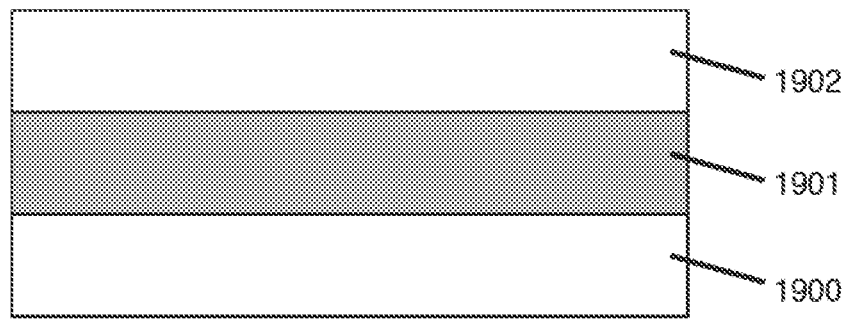
FIG. 2 illustrates an exemplary semiconductor structure of the invention comprising a substrate and a layer of the invention, as described herein, formed over the substrate, and an active layer formed over the layer of the invention.

Referring to FIG. 2, the first aspect of the invention further provides a semiconductor structure according to any of the preceding embodiments of the first aspect, or combinations thereof, comprising a substrate (1900), a epitaxial layer having a thickness greater than 50 nm (1901), and further comprising an active layer (1902) formed over the epitaxial layer. Such layer, (1902) may be discontinuous (e.g., islands or quantum dots) or continuous as illustrated in FIG. 2.

In one embodiment of the first aspect, the active layer (1902) is lattice-matched to the epitaxial layer.

In one embodiment of the first aspect, the active layer (1902) is epitaxial.

In another embodiment of the first aspect, the active layer (1902) is formed directly on the epitaxial layer (1901).

The active region (1902) may comprise a Group III nitride. In various embodiments, the Group III nitride comprises GaN, AlGaN, InGaN, AlInGaN, AlN, InN, SiCAlN, or mixtures thereof as well as other tetrahedral semiconductors such as SiC and Ge.

The substrate (1800) and/or (1900) may comprise Si (e.g., p- or n-doped Si), $Al_2O_3$ (e.g., sapphire), SiC or GaAs. In one embodiment, the substrate comprises Si(100). In another embodiment, the substrate comprises Si(111).

In another embodiment of the first aspect, the substrate comprises a miscut Si(111) wafer. While the preceding embodiments provide a path to significant materials improvement, it has been unexpectedly been found that $Hf_xZr_{1-x}B_2$ layers with superior morphological quality can be grown directly on Si wafers that are miscut. In particular, the layers formed on miscut Si(111) wafer display incredibly flat surfaces covering surface areas in excess of at least 50 μm². Such surface morphologies are highly desired for the assembly of multi-layered semiconductor devices as they lead to more highly uniform structure with lower levels of dislocations and/or other crystalline boundaries between and within the individual layers, respectively.

The Si(111) wafer may be miscut by about 0.5-about 8 degrees, or about 1-6 degrees, or about 2-5 degrees. In particular, when the substrate comprises a miscut Si(111) wafer, the epitaxial layer formed over the substrate generally has an atomically flat surface over an area greater than about 50 μm². Often, when the substrate comprises a miscut Si(111) wafer, the epitaxial layer formed over the substrate generally has an atomically flat surface over an area greater than about 100 μm². In a preferred embodiment, the epitaxial layer has an atomically flat surface over an area greater than about 250 μm², or 500 μm² or 1 mm². The extent of the flat nature of an epitaxial layer surface can be readily determined by one skilled in the art by, for example, optical microscopy and/or atomic force microscopy techniques.

The active layer (1902) may be formed according to methods such as, for example, gas source molecular beam epitaxy, as is familiar to one skilled in the art. In another embodiment, the active layer may be formed by chemical vapor deposition. Such methods are described in U.S. Patent Publication No. 2006/0236923, filed on Feb. 12, 2004, and hereby incorporated by reference in its entirety.

Methods for Forming the Epitaxial Layer

In the prior art, $ZrB_2$ films having a thickness less than about 25-50 nm were typically grown by gas source molecular beam epitaxy (GS-MBE) of a precursor ($Zr(BH_4)_4$) at a temperature of 900° C. and a pressure of $10^{-7}$ Torr. However, initial rapid growth rate studies conducted at higher pressures resulted in poisoning of the surface with B-rich fragments [possibly due to gas phase reactions of the $Zr(BH_4)_4$] and high surface roughness of approximately 20 nm.

To overcome these problems the instant invention provides a precursor gas comprising a diluent and one or more sources of B and one or more sources of Zr, Hf, and or Al. The diluent generally comprises hydrogen, and preferably, high purity hydrogen as is familiar to those skilled in the art. As one skilled in the art would understand, a single source may comprise both a source of B and a source of Zr, Hf, and/or Al. For example, $Zr(BH_4)_4$ and $Hf(BH_4)_4$ are each sources for B as well as Zr and Hf, respectively. Other diluents may be used, for example, non-reactive gases such as helium and/or argon may be added to the precursor gas.

Typically, the precursor gas comprises a diluent and one or more sources for the B as well as one or more sources for the Zr, Hf, and/or Al which comprise the epitaxial layer. Appropriate sources for the precursor gas include, but are not limited to $Zr(BH_4)_4$, $Hf(BH_4)_4$, and/or Al sources, such as a Knudsen cell evaporator as a source of atomic Al. Alternatively, $Al(BH_4)_3$-aluminum triborohydride may be used as an Al source. The high volatility of the precursor gas component at room temperature (e.g., the vapor pressure of $Zr(BH_4)_4$ and $Al(BH_4)_3$ are 8 Torr and 100 Torr, respectively) makes them very useful for gas source MBE applications. $Al(BH_4)_3$ thermally decomposes at the surface of a substrate, such as Si(111), to incorporate $AlB_2$ in the epitaxial layer and gaseous byproducts $H_2$ and diborane $B_2H_6$ by the reaction:

$$2Al(BH_4)_3 \rightarrow 2AlB_2 + B_2H_6 + 9H_2$$

In one embodiment of the invention the precursor gas comprises $Zr(BH_4)_4$, $Hf(BH_4)_4$, and/or $Al(BH_4)_3$ to a total volume of about 0.1 to about 5% v/v and high purity hydrogen. In a specific embodiment, the precursor gas comprises about 1 to about 3% v/v $Zr(BH_4)_4$, $Hf(BH_4)_4$, and/or $Al(BH_4)_3$ and high purity $H_2$. However it will be understood, other mixing volumes can also be used, and other diluents including but not limited to hydrogen with different purity levels can also be used. Utilizing the preceding precursor gas, films with thicknesses up to approximately 500 nm, with atomically flat surfaces (e.g., surface roughness of ~2 nm) have been obtained. Other thickness films can also be obtained as were discussed previously (supra).

Often the excess of hydrogen comprises greater than 95% v/v of the precursor gas; preferably, hydrogen comprises greater than 97% v/v of the precursor gas; even more preferably, hydrogen comprises greater than about 98% v/v of the precursor gas.

In embodiments of the invention, epitaxial $Zr_{1-x}Hf_xB_2$ layers have been synthesized across the entire compositional range (0≤x≤1), and their usefulness for simultaneous thermal and lattice matching applications has been studied.

In an embodiment of the invention, epitaxial $Zr_{1-x}Hf_xB_2$ layers may be grown by GS-MBE using the $Hf(BH_4)_4$ and $Zr(BH_4)_4$ precursors mixed with $H_2$ at about 0.1 to about 5% v/v.

In another embodiment of the invention, epitaxial $Zr_{1-x}Hf_xB_2$ layers may be grown by GS-MBE using the $Hf(BH_4)_4$ and $Zr(BH_4)_4$ precursors mixed with $H_2$ at about 1 to about 3%. In another embodiment of the invention, epitaxial $Zr_{1-x}Hf_xB_2$ layers may be grown by GS-MBE using the $Hf(BH_4)_4$ and $Zr(BH_4)_4$ precursors mixed with $H_2$ at about 2% by volume.

The composition in an epitaxial layer of the formula, $Zr_{1-x}Hf_xB_2$, may be tuned by varying the ratio of $Hf(BH_4)_4/Zr(BH_4)_4$ in the stock mixture. For example, the ratio of $Hf(BH_4)_4$ to $Zr(BH_4)_4$ may be varied from 100:1 to 1:100, and any value in between, for example, about 1:1.

The epitaxial layer is generally formed at a temperature of about 800 to 1000 degrees Celsius. Preferably, the epitaxial layer is formed at a temperature of about 850 to 950 degrees Celsius. More preferably, the epitaxial layer is formed at a temperature of about 875 to 925 degrees Celsius. Further, the precursor gas is generally provided at a pressure of about $1\times10^{-3}$ to $1\times10^{-9}$ Torr Preferably, the precursor gas is provided at a pressure of about $1\times10^{-5}$ to $1\times10^{-7}$ Torr Integration of Group III Nitrides Utilizing Epitaxial Layers The epitaxial layers described herein are particularly useful for the integration of Group III nitride alloy layers over a substrate. In particular, the semiconductor structures comprising the epitaxial layers of the present invention can be used, for example, to support the growth of group III nitride materials on a substrate. The tunable structural, thermoelastic and optical properties make the $HfB_2$—$ZrB_2$ system suitable for broad integration of III nitrides with Si.

In one non-limiting example, the buffer layer helps support growth of group III nitride materials on a substrate. Such resulting semiconductor structures having group III nitride materials can be used for active semiconductor devices, such as transistors, field emitters, light-emitting optoelectronic devices, and optoelectronic devices.

In a third aspect, the present invention provides methods for integrating Group III nitrides onto a substrate comprising, forming a thick buffer layer of a diboride of Zr, Hf, Al, or mixtures thereof, over a substrate; and forming a Group III nitride layer over the buffer layer. Such Group III nitrides layers, may be discontinuous (e.g., islands or quantum dots) or continuous.

In various further embodiments of the third aspect, the buffer layer has a thickness greater than 50 nm, 100 nm, 150 nm, 200 nm, 250 nm; 300 nm, 350 nm, or 400 nm. The buffer layers of the invention may have any maximal thickness suitable for a given purpose. In one embodiment, the buffer layer may have a thickness of less than 2-3 μm; in further embodiments, the buffer layer may have a thickness of less than 1.5 μm or 1 μm.

As used herein, the buffer layer may have a thickness of 50 nm to 2 μm, 100 nm to 2 μm or 200 nm to 2 μm. In various further embodiments of the third aspect, the buffer layer may have a thickness of 50 nm to 1.5 μm; 100 nm to 1.5 μm; 150 nm to 1.5 μm; 200 nm to 1.5 μm; 250 nm to 1.5 μm; 300 nm to 1.25 μm; 350 nm to 1.25 μm; 400 nm to 1.25 μm; or 400 nm to 1 μm.

In another embodiment of the third aspect, the buffer layer is formed directly on the substrate.

In another embodiment of the third aspect, the buffer layer is epitaxial.

In another embodiment of the third aspect, the buffer layer is relaxed at 900° C.

In another embodiment of the third aspect, the buffer layer has a coefficient of thermal expansion which is essentially identical to the bulk.

In another embodiment of the third aspect, the mismatch strain of the buffer layer is essentially thermally constant over a temperature range of room temperature to 900° C.

In various embodiments of the third aspect, the buffer layer comprises $ZrB_2$, $AlB_2$, $HfB_2$, $Hf_xZr_{1-x}B_2$, $Hf_xAl_{1-x}B_2$, $Zr_xAl_{1-x}B_2$, or $Zr_xHf_yAl_{1-x-y}B_2$, wherein the sum of x any y is less than or equal to 1. In a further embodiment, the buffer layer comprises $ZrB_2$.

In another embodiment of the third aspect, the Group III nitride layer is formed directly on the buffer layer. In yet another embodiment of the third aspect, the Group III nitride comprises a compound selected from the group consisting of GaN, AlGaN, InGaN, AlInGaN, AlN, InN, SiCAlN, or mixtures thereof.

In one embodiment of the second aspect, the Group III nitride layer is lattice-matched to the buffer layer.

In another embodiment of the third aspect, the substrate comprises Si, $Al_2O_3$, SiC or GaAs. In various embodiments of the third aspect, the substrate comprises Si(111). In other various embodiments of the third aspect, the substrate comprises Si(100). In a preferred embodiment of the third aspect, the substrate comprises a miscut Si(111) wafer. The Si(111) wafer may be miscut by about 0.5-about 8 degrees, or about 1-6 degrees, or about 2-5 degrees.

In another embodiment, the Group III nitride layer may be formed by molecular beam epitaxy, as is familiar to one skilled in the art. In another embodiment, the Group III nitride layer may be formed by chemical vapor deposition (CVD) or metal organic chemical vapor deposition (MOCVD). Such methods are described in U.S. Patent Publication No. 2006/0236923, filed on Feb. 12, 2004, and hereby incorporated by reference in its entirety.

Methods for Forming Group III Nitride Layers

In a fourth aspect, the invention provides a method for forming an $Al_xGa_{1-x}N$ layer over a substrate comprising, contacting a substrate with $H_2GaN_3$, $D_2GaN_3$, or mixtures thereof in the presence of an Al source at a temperature and a pressure to form a $Al_xGa_{1-x}N$ layer, wherein the temperature is less than about 800° C.

Without being limited by any one particular theory of operation, the formation of alloys at this temperature implies that the electron-rich $N_3$ groups of the $H_2GaN_3$ or $D_2GaN_3$ molecule have sufficient reactivity to combine with the acidic Al atoms to form the necessary Al—N—Ga bonding arrangements without any additional activation. The mechanism of this interaction may involve the formation of reactive intermediates such as the "$D_2GaN_3$:Al" complex which then react on the substrate surface to yield $Ga_{1-x}Al_xN$ and $H_2/D_2/N_2$ byproducts. In this connection Lewis-acid base type Ga—N—N—N-M bonding motifs have been observed in the structures of molecular azides of group III compounds. At 700° C. any Ga—N—Al fragments derived from the instant decomposition of "$D_2GaN_3$:Al" diffuse and combine to form a uniform and continuous crystalline layer. Below this temperature elemental Al may segregate on the wafer surface suggesting that the "D$_2$GaN$_3$:Al" complexes disproportionate to produce clusters of elemental Al which poisons the surface and prevents any further assembly of crystalline nitrides. Another competitive mechanism for the AlGaN formation could involve the displacement of Ga within adsorbed Ga$_3$N$_3$ units by the impinging Al atoms at the growth surface. In this cases since the Al—N bond is significantly stronger than the Ga—N counterpart the liberated Ga can diffuse on the surface and function as a surfactant to promote an organized assembly of the growing film. It may eventually evaporate from the growth front into the vacuum owing to its high vapor pressure at the deposition conditions (e.g., 10$^{-7}$ Torr and 700° C.).

In one embodiment of the fourth aspect, the substrate is contacted with H$_2$GaN$_3$ in the presence of an Al source. In another embodiment, the substrate is contacted with D$_2$GaN$_3$ in the presence of an Al source. The Al source may be any source known to those skilled in the art for supplying elemental Al to the substrate. For example, the Al source may be elemental Al atoms evaporated from a Knudsen cell.

Preferably, the contacting occurs at a temperature of less than about 700° C., or at a temperature ranging from about 500° C. to about 700° C. The pressure for the contacting is generally ranges from about 1×10$^{-8}$ Torr to about 1×10$^{-6}$ Torr; preferably, the pressure ranges from about 2-8×10$^{-7}$ Torr.

The substrate may be homogeneous, such as a Si(100) or Si(111) wafer, or comprise one or more materials, such as one or more overlayers on a base substrate. For example, the substrate may comprise a buffer layer of ZrB$_2$ formed over a Si substrate.

In one embodiment, the substrate comprises a group III nitride, such as, but not limited to GaN. In particular, the substrate may comprise a layer of GaN formed over a base substrate, such as Si(100) or Si(111). In one embodiment, the substrate comprises a layer of GaN formed over a buffer layer (e.g.;. ZrHfAlB$_2$) where the buffer layer is formed over a base substrate, such as Si (100) or Si(111).

The Al$_x$Ga$_{1-x}$N layer may be prepared according to the preceding methods such that x has a value between 0 and 1. In a preferred embodiment, the Al$_x$Ga$_{1-x}$N layer thus formed has a value of x between about 0.01 to about 0.20; more preferably, the Al$_x$Ga$_{1-x}$N layer has a value of x between about 0.01 to about 0.10.

In various further embodiments of the fourth aspect, the Al$_x$Ga$_{1-x}$N layer may have a thickness greater than 10 nm, 25 nm, 50 nm, 100 nm, 150 nm, 200 nm, 250 nm; 300 nm, 350 nm, or 400 nm. The Al$_x$Ga$_{1-x}$N layers of the invention may have any minimal or maximal thickness suitable for a given purpose. In one embodiment, the Al$_x$Ga$_{1-x}$N layer may have a thickness of less than 2-3 µm; in further embodiments, the Al$_x$Ga$_{1-x}$N layer may have a thickness of less than 1.5 µm or 1 µm.

In any of the preceding embodiments of the fourth aspect, the Al$_x$Ga$_{1-x}$N layer is elementally homogeneous. In any of the preceding embodiments of the fourth aspect, the Al$_x$Ga$_{1-x}$N layer is monocrystalline. Preferably, in any of the preceding embodiments of the fourth aspect, the Al$_x$Ga$_{1-x}$N layer is epitaxial.

In any of the preceding embodiments of the fourth aspect, the substrate may comprise a semiconductor structure according to the first aspect of the invention.

Similarly, in any of the preceding embodiments of the fourth aspect, the substrate may comprise a semiconductor structure prepared according to the second aspect of the invention.

Further, in any of the preceding embodiments of the fourth aspect, the substrate may comprise a semiconductor structure prepared according to the third aspect of the invention.

Applications

The semiconductor structures of the present invention or formed according to the methods of the present invention may form part of an operable microelectronic device. The semiconductor structures of any embodiment (or combination thereof) of the second aspect may similarly function as an operable microelectronic device. Further, the semiconductor structures of any embodiment of the second aspect (or combination thereof) may form part of an operable optoelectronic device, or itself function as an operable microelectronic device.

For example, the structures described or prepared according to the methods herein may be used in, but not limited to, heterostructure field effect transistors (HFET) (see, Maeda, et al., *Phys. Stat. Sol.* (a) 188, No. 1, pp. 223-226 (2001), which is incorporated herein by this reference); double heterojunction bipolar transistors, (DHBT) (see, Malcinoto, et al. *Phys. Stat. Sol.* (a) 188, No. 1, pp. 183-186 (2001), which is incorporated herein by this reference); multiple quantum well (MQW) lasers (see, Nakamura, et al. *J. Crystal Growth* 189/190, pp. 841-845 (1998); and Kuramata, et al. *J. Crystal Growth* 189/190 pp. 826-830 (1998), each of which is incorporated herein by this reference); and ultraviolet light-emitting diodes (UV LEDs) (see, Mukai, et al. *J. Crystal Growth* 189/190 pp. 778-781 (1998), which is incorporated herein by this reference).

(a) Tuning Reflectivity

UV-IR ellipsometric measurements indicate that the reflectivity of pure HfB$_2$ is higher than that of ZrB$_2$, indicating that this material might be significantly better than ZrB$_2$ as a reflective lattice matched template for nitride device fabrication on absorbing Si wafers.

Figure 13:
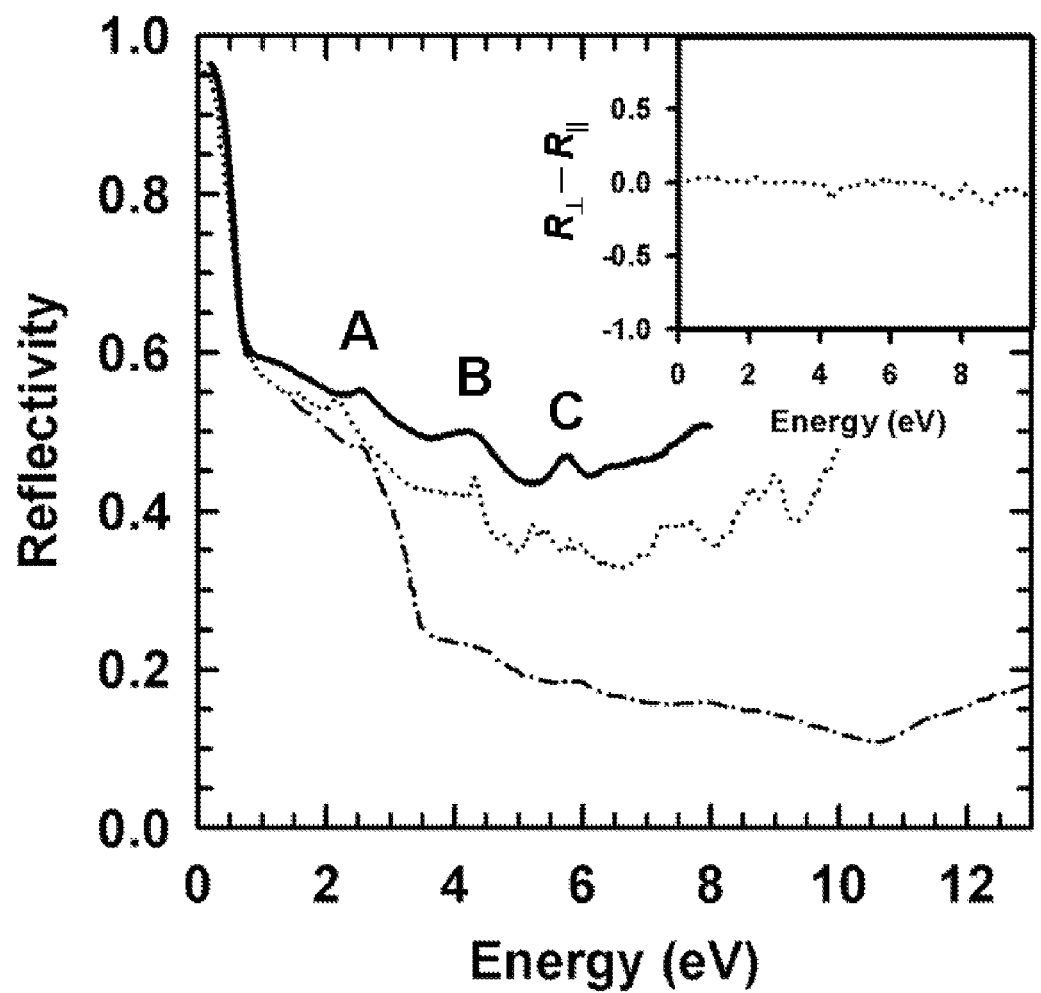
FIG. 13 is a graph showing the reflectivity plot of $ZrB_2$ films grown on Si(111) (Solid line) derived form ellipsometry IR, Vis and UV measurements; the dotted line is a all-electron FPLAPW-DFT simulation; the dot-dashed line is the reflectivity data from bulk $ZrB_2$ crystals as obtained by Oda and Fukui; the inset is anisotropy in the reflectivity based on theory ($R_\|$ and $R_\perp$ are the reflectivities with polarization parallel and perpendicular to the basal plane, respectively).

The air reflectivity of pure ZrB$_2$ grown on Si(111) is plotted as a function of incident photon energy in FIG. 13, where it is compared with the reflectivity of bulk Si. The sample exhibits metallic behavior with a reflectivity increasing sharply from values near 0.5 to unity at low photon energy (IR region). However, in the region from 2-6 eV (620-200 nm) relevant to many III-N applications the reflectivity of ZrB$_2$ is lower than that Si.

The reflectivities of ZrB$_2$, HfB$_2$, and Si simulated from first principles using density functional theory (full-potential linearized augmented plane wave method; EXCITING DFT code) illustrate the ability of the ZrB$_2$—HfB$_2$ system to tune the optical properties of buffer layers on Si. For more information about the code, see J. K. Dewhurst, S. Sharma and C. Ambrosch-Draxl, EXCITING FPLAPW code Version 0.9.57 (2006), incorporated herein by reference.

Due to the semi-metallic character of the compounds the complex dielectric function $\in = \in_1 - i \in_2$ was calculated as the sum of interband and intraband contributions. (See C. Ambrosch-Draxl and J. O, Sofo, Comp. Phys. Comm. 175, 1 (2006), incorporated herein by reference. The latter are described using Drude expressions $$\in_1^{INTRA} = 1 - \omega_p^2/(\omega^2 + i\omega\Gamma)$$

where $\omega_p$ is the free-electron plasma frequency (calculated values are $\hbar\omega$P=4.56 and 4.81 eV for ZrB$_2$ and HfB$_2$, respectively). A lifetime broadening value of Γ=50 meV was found to reproduce the observed low energy behavior. The steep rise observed in IR reflectivities of both HfB$_2$ and ZrB$_2$ is due to the Drude term.

The close agreement between the observed and simulated spectra for Si and ZrB$_2$ suggests that the reflectivity of pure HfB$_2$ films should be about 20% larger than that of ZrB$_2$ in the 2-8 eV range. Zr$_x$Hf$_y$Al$_{1-x-y}$B$_2$ (0≤x≤1, 0≤y≤1) materials grown on Si can offer tunable reflectivities across the entire spectral range. This behavior can be of particular significance for the design of nitride based interband (near-IR) and inter-sub-band (IR) devices grown on buffered Si.

In a fifth aspect, the invention provides a method for tuning the reflectivity of a buffer layer comprising, forming a buffer layer of an alloy of the formula Hf$_x$Zr$_{1-x}$B$_2$ having a thickness greater than about 50 nm and a reflectivity over a substrate, wherein x is a predetermined value from 0 to 1, and wherein the reflectivity of the buffer layer is greater than a layer of ZrB$_2$ having an identical thickness as the buffer layer.

In various embodiments of the fifth aspect, the buffer layer may have a thickness greater than 50 nm, 100 nm, 150 nm, 200 nm, 250 nm; 300 nm, 350 nm, or 400 nm. The buffer layer of the invention may have any minimal or maximal thickness suitable for a given purpose. In one embodiment, the buffer layer may have a thickness of less than 2-3 µm; in further embodiments, the buffer layer has a thickness of less than 1.5 µm or 1 µm.

In one embodiment, a semiconductor structure is provided comprising a substrate, a buffer layer comprising Zr$_x$Hf$_y$Al$_{1-x-y}$B$_2$ (0≤x≤1, 0≤y≤1) formed over the substrate, and an active layer formed over the substrate, wherein the active layer is lattice matched to the buffer layer.

In another embodiment, a semiconductor structure is provided comprising a substrate, a buffer layer comprising Zr$_x$Hf$_y$Al$_{1-x-y}$B$_2$ (0≤x≤1, 0≤y≤1) formed over the substrate, and an active layer formed over the substrate, wherein the active layer is relaxed.

In another embodiment, a semiconductor structure is provided comprising a substrate, a buffer layer comprising Zr$_x$Hf$_y$Al$_{1-x-y}$B$_2$ (0≤x≤1, 0≤y≤1) formed over the substrate, and an active layer formed over the substrate, wherein the active layer is relaxed and lattice matched to the buffer layer In any of the preceding embodiments, the active layer may comprise a Group III nitride. For example, the Group III nitride may comprise AlGaN or GaN. In one embodiment, the Group III nitride may comprise Al$_x$Ga$_{1-x}$N, wherein x is greater than about 0.10.

In various embodiment, the substrate comprises Si(111). In other various embodiments, the substrate comprises Si(100). In a preferred embodiment, the substrate comprises miscut Si(111); preferably, the substrate comprises a miscut Si(111) wafer. The Si(111) wafer may be miscut by about 0.5-about 8 degrees, or about 1-6 degrees, or about 2-5 degrees.

(b) Tuning Lattice Constant

Alloys of ZrB$_2$, with bulk hexagonal lattice constants a$_0$=3.169 Å, c$_0$=3.525 Å, and HfB$_2$ (a$_0$=3.142 Å and c$_0$=3.48 Å) have lattice constants smaller than those of ZrB$_2$, and therefore make it possible to grow higher Al content Al$_x$Ga$_{1-x}$N layers with less strain, paving the way towards full integration of these materials with substrates such as Si.

A hybrid substrate technology (based on alloys of ZrB$_2$ and the HfB$_2$) has been developed that extends the lattice matching capability on silicon for growth of wider band gap Al$_x$Ga$_{1-x}$N with x>0.10. Solid solutions of Zr$_{1-x}$Hf$_x$B$_2$ possess tunable lattice constants lower than that of ZrB$_2$, well within the Al$_x$Ga$_{1-x}$N range of interest.

In a sixth aspect, the invention provides a method for tuning the lattice constant of a buffer layer comprising, forming a buffer layer of an alloy of the formula Hf$_x$Zr$_{1-x}$B$_2$ having a thickness greater than about 50 nm, and forming an active layer over the buffer layer, wherein x is a predetermined value from 0 to 1, and wherein the active layer is lattice matched to the buffer layer.

In various embodiments of the sixth aspect, the buffer layer may have a thickness greater than 50 nm, 100 nm, 150 nm, 200 nm, 250 nm; 300 nm, 350 nm, or 400 nm. The buffer layer of the invention may have any minimal or maximal thickness suitable for a given purpose. In one embodiment, the buffer layer may have a thickness of less than 2-3 µm; in further embodiments, the buffer layer may have a thickness of less than 1.5 µm or 1 µm.

In one embodiment, a semiconductor structure is provided comprising a substrate, a buffer layer comprising Zr$_x$Hf$_y$Al$_{1-x-y}$B$_2$ (0≤x≤1, 0≤y≤1) formed over the substrate, and an active layer formed over the substrate, wherein the active layer is lattice matched to the buffer layer.

In another embodiment, a semiconductor structure is provided comprising a substrate, a buffer layer comprising Zr$_x$Hf$_y$Al$_{1-x-y}$B$_2$ (0≤x≤1, 0≤y≤1) formed over the substrate, and an active layer formed over the substrate, wherein the active layer is relaxed and lattice matched to the buffer layer.

In any of the preceding embodiments, the active layer may comprise a Group III nitride.

For example, the Group III nitride may comprise AlGaN or GaN. In one embodiment, the Group III nitride may comprise Al$_x$Ga$_{1-x}$N, wherein x is greater than about 0.10.

In various embodiment, the substrate comprises Si(111). In other various embodiments, the substrate comprises Si(100). In a preferred embodiment, the substrate comprises miscut Si(111); preferably, the substrate comprises a miscut Si(111) wafer. The Si(111) wafer may be miscut by about 0.5-about 8 degrees, or about 1-6 degrees, or about 2-5 degrees.

(c) Distributed Bragg Reflectors and Superlattices

It will also be understood that buffer layer in the preceding description of the invention may include more than two different layer types, wherein each layer type is periodically repeated through a superlattice. Thereby, in a seventh aspect, the invention provides a semiconductor structure comprising, a stack comprising a plurality of repeating alloy layers, formed over a substrate, wherein the repeating alloy layers comprise two or more alloy layer types, wherein at least one alloy layer type comprises a Zr$_z$Hf$_y$Al$_{1-z-y}$B$_2$, alloy layer, wherein the sum of z and y is less than or equal to 1, and the thickness of the stack is greater than about 50 nm.

Figure 25:
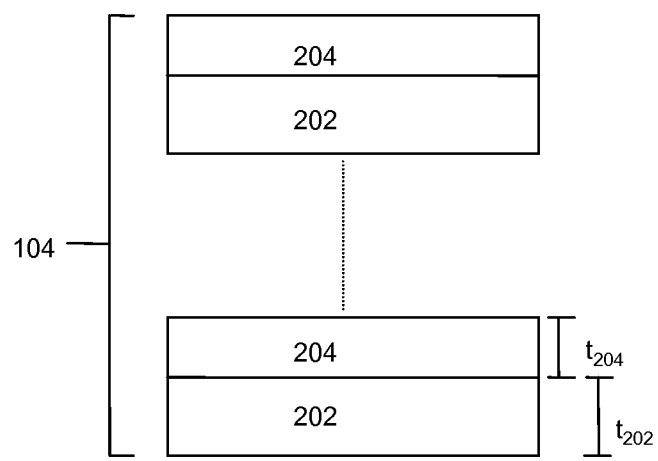
FIG. 25 is a cross section of a buffer region of a semiconductor device in accordance with the invention.

Referring to FIG. 25, an exemplary embodiment of the seventh aspect is illustrated using two layer types for simplicity and ease of discussion. Buffer region 104 may be about 50 nm to 1000 nm or 100 nm to 1000 nm thick, although thicker layers may also be grown, whereas the thickness of individual layers (e.g., t$_{202}$ and t$_{204}$) may be of the order of several nanometers or tens of nanometers (e.g., 5 nm to 50 nm).

Generally, when the stack comprises two types of alloy layers, A and B, respectively, the stack comprises a structure of the form -(AB)$_n$—, where n is greater than or equal to 1; when the stack comprises three types of alloy layers, A, B, and C, respectively, then stack comprises a structure of the form -(ABC)$_n$—, —(BAC)$_n$—, -(ACB)$_n$—, —(BCA)$_n$-, —(CBA)$_n$-, or —(CAB)$_n$—, where n is greater than or equal to 1. Preferably, n is about 1 to 100; more preferably, n is about 1 to 50; even more preferably, n is about 1 to about 10.

When the stack comprises four types of alloy layers, A, B, C, and D, respectively, then stack may comprises, for example, a structure of the form -(ABCD)$_n$-, -(ABDC)$_n$—, -(ACBD)$_n$-, -(ACDB)$_n$—, -(ADBC)$_n$—, -(ADCB)$_n$—, —(BACD)$_n$-, —(BADC)$_n$—, —(BCAD)$_n$—, —(BCDA)$_n$-, —(BDAC)$_n$—, —(BDCA)$_n$-, —(CABD)$_n$-, —(CADB)$_n$—, —(CBAD)$_n$-, —(CBDA)$_n$-, —(CDAB)$_n$—, —(CDBA)$_n$-, -(DABC)$_n$—, -(DACB)$_n$—, -(DBAC)$_n$—, -(DBCA)$_n$-, -(DCAB)$_n$—, or -(DCBA)$_n$-, Preferably, n is about 1 to 100; more preferably, n is about 1 to 50; even more preferably, n is about 1 to about 10.

Additionally, knowledge of the dielectric functions and reflectivities of $Zr_xHf_yAl_{1-x-y}B_2$ allows the design of buffers with tailored reflectivities. Design rules for structures with tailored reflectivities, such as Distributed Bragg Reflectors (DBRs), anti-reflection coatings and the like are described by Hecht in "Optics (4th Edition)", Addison Wesley Publishing Company, 2002, incorporated herein by reference. A DBR mirror structure consists of alternate layers of materials with different refractive indices. The optical thickness of each layer is one quarter of the design wavelength—that is, the wavelength for which the reflector is designed to have high reflectivity (also referred to as center wavelength). Physically, the thickness of a DBR layer for a DBR designed for a center wavelength lambda (λ) is given by t=λ/4n where n is the refractive index of the material at the wavelength λ. At this wavelength, the partial waves reflected at the interfaces between these layers interfere constructively, resulting in a very high reflectance within a narrow spectral region. The reflectivity spectrum has a center wavelength (λ) and a wavelength range either side where the reflectivity can be high. The magnitude of the reflection at a given wavelength, and the wavelength dependency of the reflectivity spectrum are determined by the refractive index difference between the two materials, and the number of layers forming the mirror structure. Thus it is possible to design a buffer layer that can be epitaxially grown on a substrate to have a high reflectivity that can be used by the nitride device formed on the buffer.

The substrate may comprise Si, Ge, SiGe, $Al_2O_3$, SiC or GaAs. In various embodiments of the sixth aspect, the substrate comprises Si(111). In other various embodiments of the seventh aspect, the substrate comprises Si(100). In a preferred embodiment of the seventh aspect, the substrate comprises miscut Si(111). In a preferred embodiment of the seventh aspect, the substrate comprises a miscut Si(111) wafer. The Si(111) wafer may be miscut by about 0.5-about 8 degrees, or about 1-6 degrees, or about 2-5 degrees, or about 4 degrees.

Each of the plurality of repeating alloy layers may have a thickness ranging from about 2 nm to about 500 nm. Preferably, each repeating alloy layer has a thickness ranging from about 5 to 100 nm or from about 100 nm to about 500 nm.

The thickness of the stack is generally greater than about 50 nm, 100 nm, 200 nm, 300 nm, 400 nm or 500 nm. More specifically, the stack may have a thickness of about 50 nm to about 1000 nm, about 100 nm to about 1000 nm, or about 250 nm to 1.5 µm; 300 nm to 1.25 µm; 350 nm to 1.25 µm; 400 nm to 1.25 µm; or 400 nm to 1 µm. The stack of the invention may have any maximal thickness suitable for a given purpose. In one embodiment, the stack has a thickness of less than 2-3 µm; In further embodiments, the stack layer may have a thickness of less than 1.5 µm or 1 µm.

The semiconductor structure of the seventh aspect may further comprise an active layer, as defined herein, formed over the stack. In one embodiment, the active layer is formed directly on the stack. In another embodiment, the stack is formed directly on the substrate. In yet another embodiment, the active layer is formed directly on the stack and the stack is formed directly on the substrate. In such embodiments, the active layer may comprise a Group III alloy, for example, GaN, AlGaN, InGaN, AlInGaN, AlN, or InN. In other embodiments, the active layer may comprise an alloy of SiCAlN or SiC. In another embodiment, the active layer may comprise Ge.

Each of the layers in the stack, as well and the active layer, when present, may be formed according to any of the methods described herein, or according to those methods known to those skilled in the art, for example, molecular beam epitaxy, chemical vapor deposition, or sputtering. In general, it is preferred that each of the plurality of layers in the stack of the seventh aspect is epitaxial; preferably, the entire stack is epitaxial.

DEFINITIONS

The term "epitaxial" as used herein, means that a material is crystalline and fully commensurate with the substrate. Preferably, epitaxial means that the material is monocrystalline, as defined herein.

The term "monocrystalline" as used herein, means a solid in which the crystal lattice of the entire sample is continuous with no grain boundaries or very few grain boundaries, as is familiar to those skilled in the art.

The term "flat surface" when used in reference to a layer as used herein means the layer has a surface roughness which is less than about 5% the layer thickness. For example, a 100 nm layer is atomically flat when the layer has a surface roughness of less than 5 nm. The term refers to the exposed surface of the referenced layer which is generally normal to the growth direction of the layer, as would be understood by one skilled in the art.

The terms "thick film" and "thick layer" as used herein mean a film or layer having an average thickness of greater than 100-200 nm; in various further embodiments, a thick film or layer has an average thickness of at least 250 nm, 300 nm, 350 nm, or 400 nm. Thick films and layers as used herein can have any maximal thickness suitable for a given purpose. In one embodiment, a thick film or layer has a thickness of less than 2-3 µm; in various further embodiments, a thick film or layer has a thickness of less than 1.5 µm, 1.25 µm, or 1.0 µm.

Typically, as used herein, "thick films" and "thick layers" have a thickness of 100 nm to 2 µm. In various further embodiments, a thick film or layer has a thickness of 150 nm, 200 nm, or 250 nm to 2 µm, 300 nm-2 µm, 350 nm-2 µm, 400 nm-2 µm, 250 nm-1.5 µm, 300 nm-1.5 µm, 350-1.5 µm, 400 nm-1.5 µm, 250 nm-1.25 µm, 300 nm-1.25 µm, 350-1.25 µm, 400 nm-1.25 µm, 250 nm-1 µm, 300 nm-1 µm, 350-1 µm, or 400 nm-1 µm.

The term "thermally pinned" as used herein, means that the rate of thermal expansion for a material on a substrate, i.e. its coefficient of thermal expansion, essentially matches that of the substrate and the rate of thermal expansion for the material on the substrate differs from its rate of thermal expansion for the bulk material. (i.e., the substrate and the film expand at the same rate).

The term "mismatch strain" as used herein, means the strain induced in a material layer formed over a substrate by the differences in the lattice constants of the material and substrate.

The term "essentially thermally constant" as used herein, means that the referenced item changes less than 10% over the specified temperature range. Preferably, the referenced item changes less than 5% over the temperature range.

The term "lattice-matched" as used herein, means the lattice constants of the referenced materials differ by less than about 1%. (i.e., the lattice mismatch is less than about 1%).

It should be understood that when a layer is referred to as being "on" or "over" another layer or substrate, it can be directly on the layer or substrate, or an intervening layer may also be present. It should also be understood that when a layer is referred to as being "on" or "over" another layer or substrate, it may cover the entire layer or substrate, or a portion of the layer or substrate.

It should be further understood that when a layer is referred to as being "directly on" another layer or substrate, the two layers are in direct contact with one another with no intervening layer. It should also be understood that when a layer is referred to as being "directly on" another layer or substrate, it may cover the entire layer or substrate, or a portion of the layer or substrate.

EXAMPLES

Example 1

Preparation of the Epitaxial $ZrB_2$ Layers

Thick, monocrystalline $ZrB_2$ layers (up to 500 nm thick) were grown on the Si(111) hexagonal surface at a temperature, pressure and reactant concentration of 900° C., $2-4\times10^{-6}$ Torr and ~1% $Zr(BH_4)_4/H_2$, respectively. The reaction mixture based on 4 Torr/liter of $Zr(BH_4)_4$ and a large excess of research grade $H_2$ was prepared prior to each deposition by combining the pure compounds in a 1000 mL vacuum flask at total final pressure of 400 Torr. The flask was connected to the gas injection manifold of the deposition chamber, and the manifold was pumped to ~$10^{-8}$ Torr. A boron doped (1-10Ω-cm), Si(111) wafer was cleaved to 1 cm² size substrates to fit the dimensions of the sample stage. Each substrate was sonicated in methanol for 5 minutes, dried under a stream of purified $N_2$, inserted through a load lock into the growth chamber at a base pressure of $4\times10^{-10}$ Torr, and heated at 600° C. under UHV to remove surface contaminants until the pressure of the chamber was restored to background levels. The wafer was then subsequently flashed at 1150° C. five times to desorb the native oxide from the surface. To commence film growth, the wafer was heated to 900° C. by passing direct current though it. The temperature was measured with a single-color pyrometer and allowed to stabilize for 5 minutes. The precursor mixture was introduced into the chamber at a constant flow rate of ~0.08 sccm, controlled by a manual leak valve. The reaction pressure inside the chamber was maintained between $2\times10^{-6}$ and $2\times10^{-5}$ Torr during growth by dynamic pumping using a corrosion resistant turbomolecular pump. The growth conditions were judiciously tuned in a manner that follows a perfect decomposition mechanism according to the reaction,

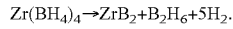
$$Zr(BH_4)_4 \rightarrow ZrB_2 + B_2H_6 + 5H_2.$$

The resulting $ZrB_2$ on Si films grew at a rate of up to 1 nm/min, yielding thicknesses up to 500 nm.

Very slowly cooling the samples from 900° C. to room temperature over the course of 30 minutes can avoid cracking of the layers (depending on thickness) due to the difference in thermal expansion between the $ZrB_2$ material and the Si substrate.

Example 2

Structural and Morphological Characterization of Epitaxial $ZrB_2$ Layers

Figure 3:
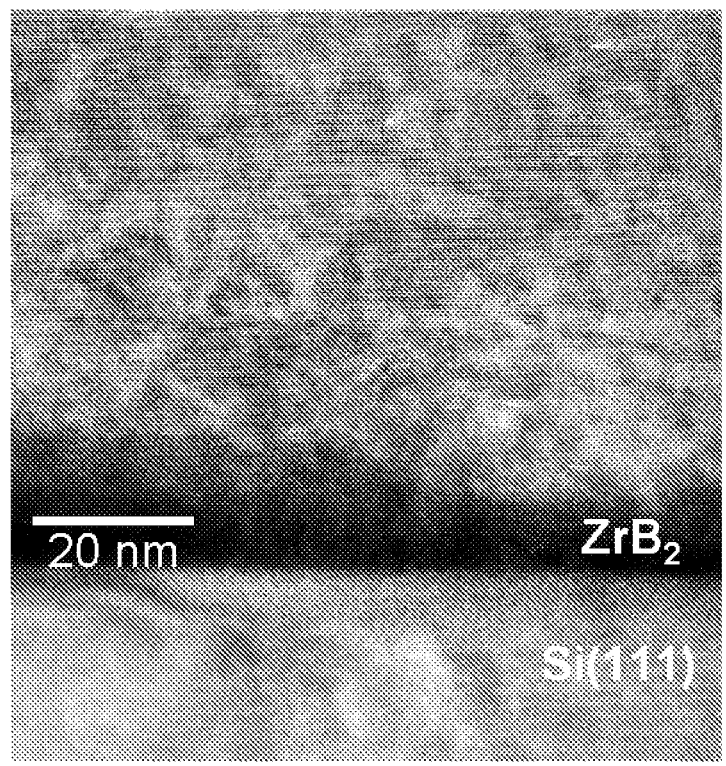
FIG. 3 is a typical high resolution XTEM micrograph from a thick $ZrB_2$ film.

The resultant films of Example 1 are fully commensurate and perfectly oriented with the underlying hexagonal surface as evidenced by various microstructural and surface characterization techniques including Rutherford backscattering (RBS) ion channeling, atomic force microscopy (AFM) and transmission electron microscopy (XTEM) (see FIG. 3). The latter reveals that heteroepitaxy between $ZrB_2$(0001) and Si(111) is obtained via coincidence-misfit mechanism in which five lattice rows of Si are aligned with every six rows of $ZrB_2$, (i.e., "magic mismatch"). This registry results in a periodic array of edge dislocations along the interface which accommodate the large difference in lattice constants.

As mentioned above it is extremely critical to maintain the optimal growth conditions and any deviations, however minor, invariably result in either negligible growth of crystalline material or in the formation of polycrystalline grains with inferior morphologies. The visual appearance of the films is metallic and reminiscent of aluminum mirrors, particularly for samples ~400-500 nm thick. Scanning electron microscopy images of the $ZrB_2$ films in plan view and cross sectional geometries appeared to be featureless and devoid of fractures or surface cracks. AFM scans showed that the film surface is dominated by an array of shallow undulations with variable lateral extent in the range from 1-2 microns in diameter. Their corresponding heights are found to be dependent on the film thickness and span 2 to 5 nm for samples with thickness 100 to 500 nm, respectively. The three dimensional habit of individual undulations resembles a hexagonal shaped pyramid with a very small aspect ratio. The vertical distance from the base to the apex is approximately 2-5 nm as determined by AFM measurements (RMS roughness). The surface structure suggests that the growth proceeds via formation of large columnar grains which terminate in pyramidal shaped apices. The convex surface portion of these features is comprised of stacked hexagonal mesas with progressively decreasing diameters. This morphology is consistent with layer-by-layer growth on the μm scale within each grain.

Example 3

High Resolution XRD Film Strain Studies of Epitaxial $ZrB_2$ Layers

The structural quality and crystallographic orientation of these thick films of Example 1 were analyzed by high resolution x-ray diffraction (HR-XRD) using a Panalytical X-pert Pro diffractometer. The θ-2θ scans revealed only the (001) and (002) peaks of the hexagonal lattice, indicating that the heterostructure is highly oriented and epitaxial. The double crystal rocking scans of $ZrB_2$(001) showed full width at half maxima (FWHM) of 0.15 degrees for 500 nm thick films, indicating no significant tilt between the crystalline domains, consistent with extremely narrow mosaicities within the horizontal direction. For samples with a nominal thickness up to 100 nm a symmetrical envelope of interference fringes is also present in the vicinity of the $ZrB_2$ peak in the θ-2θ diffraction patterns. For higher thickness samples these fringes merge within the parent (001) peak.

Extensive off-axis high-resolution measurements were also performed to determine the precise in-plane and vertical lattice parameters and to follow the evolution of the lateral strain as a function of film thickness and temperature. For this purpose, the (113) reciprocal space maps (RSM) of the $ZrB_2$ crystal ($AlB_2$-type structure) were recorded owing to its relatively high intensity and geometric accessibility within the scattering configuration of our diffraction apparatus. Routine and reproducible sample alignment was carried out using the (224) reflection of the Si(111) wafer as a reference point due to its close proximity in reciprocal space to the epilayer (113) peak. For a typical 500 nm thick $ZrB_2$/Si(111) a detailed analysis of the reciprocal space maps at room temperature yielded correlation lengths of ~0.5 μm and angular tilt between adjacent grains of ~658 arcseconds indicating that this material is of high crystalline quality Similar values are obtained for all films studied irrespective of their thickness. The measured lattice parameters for this sample, a=3.1857 Å and c=3.5212 Å, were found to be slightly different than the relaxed bulk $ZrB_2$ values $a_0$=3.169 Å, $c_0$=3.530 Å (see, Okamoto, et al., *J. Appl. Phys.* 93, 88 (2003)), indicating that the film is tensile strained. As shown below, the strain value obtained from standard elasticity theory is approximately 0.5%.

The design of template structures based on $ZrB_2$ layers grown on Si requires a thorough understanding of the thickness and temperature dependence of the strain in the system. The variation of the strain as a function of epilayer thickness at room temperature were determined via measurement of high resolution XRD reciprocal space maps of the (113) diffraction maxima for a series of films with thicknesses in the range of 50-500 nm. In order to accurately evaluate the in-plane strain of these $ZrB_2$ films the measured a and c lattice constants were used to calculate the dimensions of the relaxed unit cell for each thickness. For hexagonal films with the plane oriented normal to the substrate surface, the perpendicular ($\in_c$) and parallel ($\in_a$) strains are given by $\in_c = -2C_{13}\in_a/C_{33}$ where $\in_c=(c-c_0)/c_0$ and $\in_a=(a-a_0)/a_0$. For bulk $ZrB_2$ the known c/a ratio (denoted by η below) is 1.1139. The room temperature elastic constants are $C_{13}$=120.5 GPa and $C_{33}$=436.1 GPa, yielding $\xi=-2C_{13}/C_{33}=-0.553$. From inversion of the strain relation the relaxed lattice constants are then given by $a_0=\{c/\eta-\xi a\}/\{1-\xi\}$ and $c_0=\eta a_0$, and these are listed in Table 1 together with the experimental values.

The relaxed lattice parameters $a_0$ and $c_0$ of the 50-500 nm thick $ZrB_2$ layers were derived using an approximation that η for the relaxed epitaxial film is identical to that of the equilibrium bulk crystals. The computed strains states of the films are given in parentheses next to the measured a and c values in Table 1.

The relaxed lattice constants of the films were calculated to be virtually the same and match the known values for the bulk phase $a_0$=3.169 Å and $c_0$=3.530 Å. This finding demonstrates the remarkable consistency of the in-plane strain determination and shows that the lattice parameters are accurate to ~0.001 Å. Strain analysis also shows that all $ZrB_2$ films with thicknesses larger than 50 nm exhibit a tensile strain with average value of $\in_a$~+0.51% and $\in_c$~−0.30%. The tensile strain does not change with increasing thickness up to 500 nm at room temperature. The residual strains were found to be remarkably robust even after the films were heated either via rapid-thermal-annealing for several seconds up to 1100° C., or by post growth treatments under UHV conditions for up to 24 hours at 900° C.

The fact that all of the $ZrB_2$ films considered were found to be tensile strained has significant implications for the use of these materials as buffer layers for nitride integration with Si. The average measured value of a at room temperature is essentially identical to that of GaN (a=3.189 Å) indicating that these buffers might be suitable platforms for integration of nitrides on Si.

However, for this strategy to succeed a thorough understanding of the evolution of strain in the $ZrB_2$ films with temperature is also required. The need for such a study is underscored by the following observation: if we assume that the $ZrB_2$ films are relaxed at the growth temperature of 900° C. and track the Si substrate (expand at the same rate) when cooling from the growth temperature, we can use the measured coefficients of thermal expansion (CTE) for bulk $ZrB_2$ ($a_a$ for the basal dimension) and bulk Si (a) to predict the strain at room temperature. Using $a_a$=6.66×10$^{-6}$ K$^{-1}$ for $ZrB_2$ (Okamoto, et al., *J. Appl. Phys.* 93, 88 (2003)), and a=3.78× 10$^{-6}$ K$^{-1}$ for Si, however, we predict a strain $\in_a$ (20° C.)~0.2% which is much smaller than the ~0.5% values observed in our samples (Table 1). In the context of this discrepancy our $ZrB_2$/Si(111) epitaxial system appears to exhibit a different behavior in comparison to typical compliant film systems grown epitaxially on mismatched substrates, i.e., Ge grown on Si.

One distinction which may account for the higher than expected tensile strain (~0.5%) and its thickness independence at room temperature is that the stiffness of the $ZrB_2$ epilayer is much greater than that of the Si substrate. Furthermore, at the high growth temperatures the present study (900° C.) the silicon substrate becomes far less mechanically rigid. The large differences in the elastic and thermal properties of $ZrB_2$ and Si are therefore likely to produce complicated and perhaps unexpected strain response in the heterostructure, particularly since the synthesis involves large variations in temperature (e.g., ΔT~900° C., compared to ΔT~400° C. in conventional semiconductor applications).

To elucidate the origin of this residual strain, a study of the thermal behavior was undertaken using representative $ZrB_2$/ Si samples with thicknesses of 200 and 400 nm, intermediate among those shown on Table 1. If the room-temperature strain in these samples is controlled by the thermal expansion differential between the $ZrB_2$ and Si upon cooling, then the above discussion implies that there must be a non-vanishing strain at the growth temperature. This strain would likely be associated with the registry at the interface (coincidence of 6 $ZrB_2$ with 5

TABLE 1

Measured lattice parameters a and c as a function of thickness h at room temperature. The corresponding lattice parameters $a_0$ and $c_0$ were calculated using η = 1.1139 and the observed[8] value $\xi$ = −0.553, yielding the strain values listed in parentheses.

| h(nm) | $a_0$ (Å) | $c_0$ (Å) | a (Å) (% strain) | c (Å) (% strain) |
|---|---|---|---|---|
| 50 | 3.171 | 3.532 | 3.1886 (0.57%) | 3.5206 (−0.31%) |
| 110 | 3.170 | 3.531 | 3.1862 (0.52%) | 3.5208 (−0.29%) |
| 150 | 3.170 | 3.531 | 3.1856 (0.57%) | 3.5206 (−0.28%) |
| 170 | 3.170 | 3.531 | 3.1870 (0.55%) | 3.5201 (−0.30%) |
| 380 | 3.169 | 3.530 | 3.1849 (0.49%) | 3.5209 (−0.27%) |
| 400 | 3.169 | 3.530 | 3.1858 (0.52%) | 3.5201 (−0.29%) |
| 500 | 3.170 | 3.531 | 3.1857 (0.50%) | 3.5212 (−0.28%) |

Si lattice rows [see, Hu, et al. *J. Cryst. Growth* 267 (3-4), 554-563 (2004); Tolle, et al., *Appl. Phys. Lett.* 84 (18), 3510-3512 (2004)] established within the first few nanometers of growth, and would become immutably fixed no matter how thickly the film is subsequently grown. Sufficiently thick films might be expected to display a vanishing strain (full relaxation) at the growth temperature. This study demonstrates that both mechanisms are in operation.

A thinner (200 nm) sample was heated to a series of temperatures in the range of 20-900° C. and the corresponding lattice parameters were recorded at each temperature using the diffractometer's Anton Paar high temperature stage capable of reaching 900° C. The heating was conducted under inert atmosphere conditions in a dynamic flow of UHP nitrogen at a 4 psi overpressure to avoid oxidation of the samples. At each temperature the film was realigned using the Si (224) reflection to correct for any sample drift associated with the diffractometer stage expansion. The lattice parameters of the boride film were determined from measurements of the off-axis $ZrB_2$ (113) reciprocal space maps (RSM).

Table 2 lists the temperature dependence of the observed film lattice parameters, a and c for $ZrB_2$, the corresponding lattice constant a for Si, the calculated relaxed values $a_0(T)$ and $c_0(T)$, and the associated strains $\in_\parallel(T)$ and $\in_\perp(T)$ obtained from the analysis. The latter were obtained using the same formalism as described above in the context of the thickness dependence of the film strain. The c/a ratio, $\eta(T)$, of a fully relaxed $ZrB_2$ film was assumed to be the same as that of a corresponding equilibrium bulk $ZrB_2$ crystal at any given temperature. The variation of $\eta(T)$ with temperature was obtained from the recently measured CTE for bulk $ZrB_2$ (including the temperature dependence of the CTE itself). The temperature dependence of the elastic ratio, $\xi(T)=-2C_{13}(T)/C_{33}(T)$, was also obtained from recent measurements of the elastic constants $C_{13}(T)$ and $C_{33}(T)$ for bulk $ZrB_2$ crystals (Okamoto, et al. *J. Appl. Phys.* 93, 88 (2003)), assuming that the strain relation $\in_\perp(T)=\xi(T)\in_\parallel(T)$ remains valid over the temperature range of our study (20-900° C.).

Figure 4:
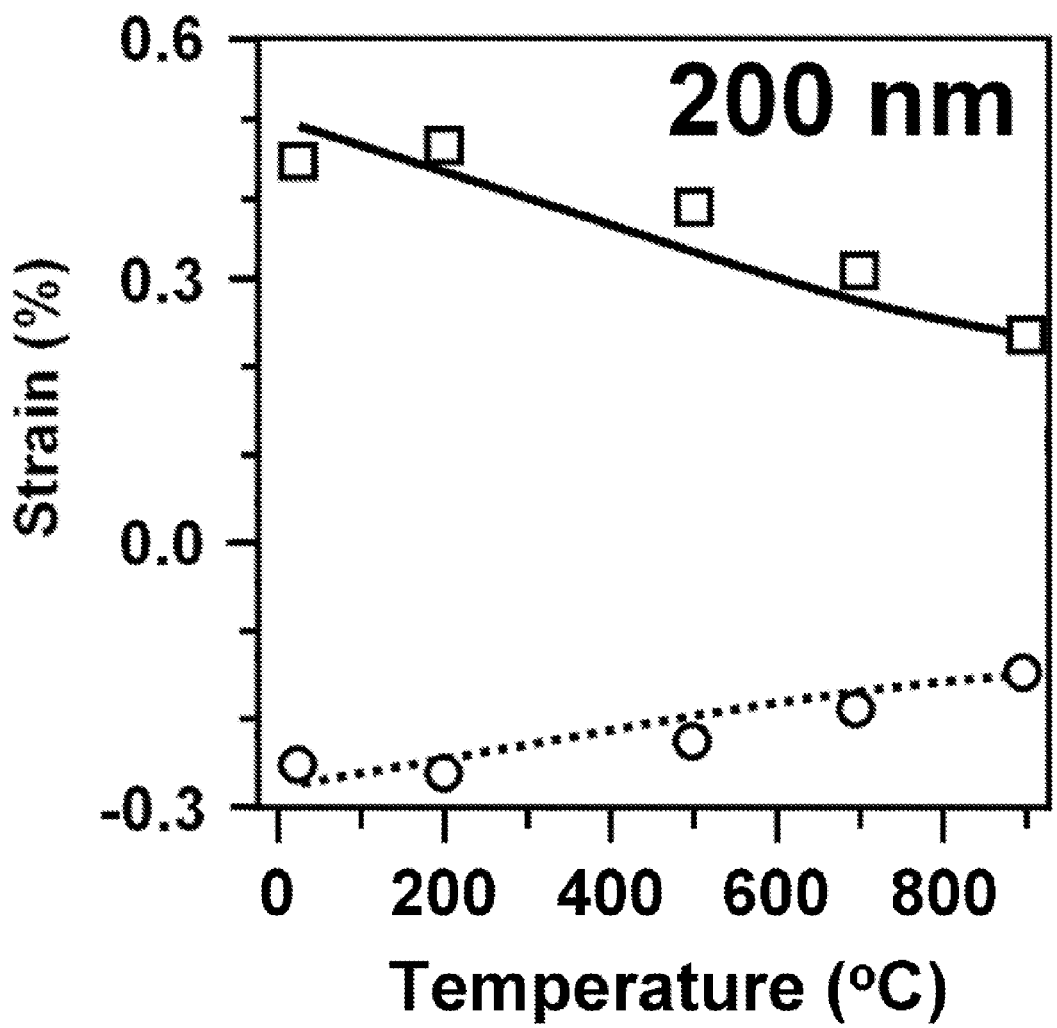
FIG. 4 shows the measured a-axis (squares) and c-axis (circles) strain as a function of temperature for the 200 nm thick $ZrB_2$ film.

The tracking behavior can be clearly seen in the temperature dependence of the strain in the 200 nm thick film which is presented graphically in FIG. 4. The lines represent the predicted trend assuming measured strains at the growth temperature and a $ZrB_2$ a-axis thermal expansion equal to that of the underlying Si. The agreement is excellent, confirming that the higher than expected tensile strain observed at room temperature (~0.5%) is due to a tensile strain $\in_a=0.26\%$ already present at the growth temperature.

Combined with the observation that all samples produced in the thickness dependence study (Table 1) have approximately the same value of tensile strain (0.5%) at room temperature, suggests that all films should also have the same value of strain ~0.26% at the growth temperature. However this appears to contradict the expectation that the strain in the thick bulk-like $ZrB_2$ films must also eventually vanish with increasing thickness.

TABLE 2

Thermal analysis of the 200 nm thick $ZrB_2$ film on Si(111). Measured values of a and c for $ZrB_2$ and a(Si) are listed in bold font. The relaxed lattice constants, $a_0$ and $c_0$, at each temperature were obtained from a strain analysis using the known temperature dependence of bulk $ZrB_2$ elastic constants and that of the equilibrium bulk c/a ratios (as described in the text). Also listed is the temperature dependence of the Si lattice constant which is well-described by a constant linear CTE

| T (° C.) | a(Si) | $a^{FIT}$(Si) | $\xi$(T) | $\eta$(T) | $n_0$ (Å) | $c_0$ (Å) | a (Å) (% strain) | c (Å) (% strain) | FILM F (%) | BULK $F_0$ (%) |
|---|---|---|---|---|---|---|---|---|---|---|
| 20  | 5.4308 | 5.4308 | −0.553 | 1.11392 | 3.1690 | 3.5300 | 3.1835 (0.46%) | 3.5212 (−0.25%) | 0.525 | 0.983 |
| 200 | 5.4339 | 5.4343 | −0.557 | 1.11400 | 3.1728 | 3.5345 | 3.1876 (0.47%) | 3.5253 (−0.26%) | 0.450 | 0.933 |
| 500 | 5.4404 | 5.4404 | −0.566 | 1.11413 | 3.1796 | 3.5425 | 3.1922 (0.40%) | 3.5346 (−0.22%) | 0.425 | 0.850 |
| 700 | 5.4449 | 5.4445 | −0.572 | 1.11422 | 3.1838 | 3.5475 | 3.1942 (0.33%) | 3.5408 (−0.19%) | 0.442 | 0.792 |
| 900 | 5.4506 | 5.4485 | −0.578 | 1.11431 | 3.1883 | 3.5527 | 3.1965 (0.26%) | 3.5474 (−0.15%) | 0.475 | 0.733 |

Table 2 also lists the coincidence lattice misfit F introduced by Matthews, (see, Matthews, Report No. RC 4266 No. 19084, 1973; R. W. Vook, *International Metals Reviews* 27 (4), 209-245 (1982); K. H. Ploog A. Trampert, *Crystal Research and Technology* 35 (6-7), 793-806 (2000)) which the present case is defined as $F=(5d_{Si-Si}-6a_{ZrB2})/(6a_{ZrB2})$, where $d_{Si-Si}=a_{Si}/\sqrt{2}$ is the Si—Si distance in the (111) plane. $F_0$ denotes the coincidence misfit calculated with bulk $ZrB_2$ parameters. From the definition it is clear that $F+\in_a=F_0$. This bulk coincidence misfit $F_0$ was calculated using thermal expansion data from Okamoto (*J. Appl. Phys.* 93, 88 (2003)), and has a room temperature value of 0.983%, which means that the $ZrB_2$ basal lattice parameter is slightly less than required for a perfect 6/5 coincidence. At the growth temperature of 900° C. the misfit decreases to a value of 0.733%, since the CTE of Si is smaller than that of the basal plane of $ZrB_2$. At this temperature the basal plain strain is $\in_a=0.26\%$, which means that 35% of the coincidence misfit is taken up by tensile strain in the $ZrB_2$ film. The remaining 65% is thus accommodated by additional misfit dislocations or by straining the interfacial region. Upon cooling to room temperature the coincidence misfit remains essentially constant, indicating that the rate of contraction of the $ZrB_2$ film in the basal plane matches that of the underlying Si.

To further elucidate the strain status of $ZrB_2$ films as a function of thickness both at their growth temperature and upon cooling, and resolve the above issues, the 200 nm film temperature study was repeated for a thicker 400 nm sample. The results are shown in Table 3 and also graphically in FIG. 5.

Figure 5:
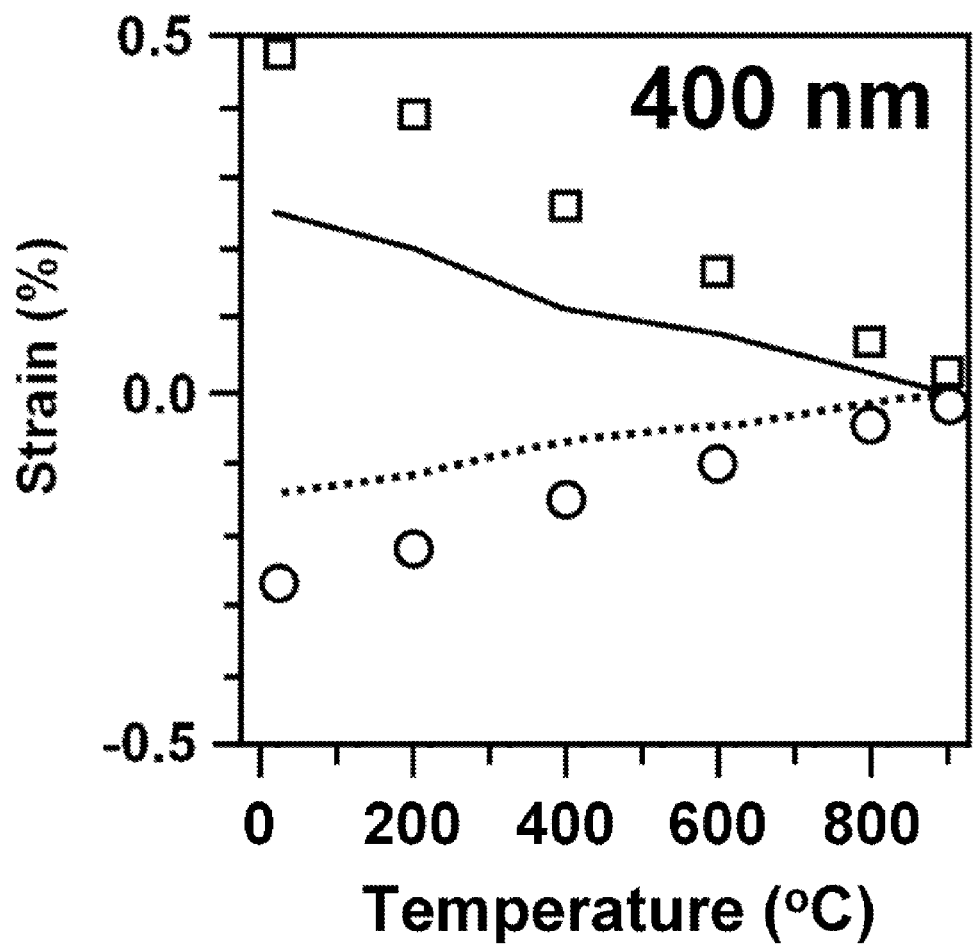
FIG. 5 shows them measured a-axis (squares) and c-axis (circles) strain as a function of temperature for the 400 nm thick $ZrB_2$ film.

While a residual strain of ~+0.26% was observed in the basal plane in the 200 nm film at the growth temperature of 900° C., the corresponding strain essentially vanishes in the 400 nm film described in Table 3. FIG. 5 compares the observed data (symbols) with the predicted trend (lines) assuming zero strain at the growth temperature and a $ZrB_2$ a-axis thermal expansion equal to that of the underlying Si for the 400 nm thick sample. The comparison shows that the strain in both a and c is larger than expected, which indicates that the $ZrB_2$ is not thermally pinned to the underlying Si.

In the case of the 200 nm thick film (see FIG. 4) the temperature dependence of the strain followed this model precisely, indicating that the epilayer and Si expand at the same rate. Thus, the most significant distinction between the thermal behavior of the thin and thick $ZrB_2$ films is that thin 200 nm sample tracks the Si but the 400 nm thick sample does not. This in turn implies the existence of a "pseudo-critical" thickness in the range of 200-400 nm, at the growth temperature 900° C.

TABLE 3

Thermal analysis of the 400 nm thick $ZrB_2$ film on Si(111) showing the same parameters as in Table 2. Note that small residual strain essentially vanishes at the growth temperature of 900° C., in contrast with the residual strain of 0.26% found for the 200 nm sample (Table 2).

| T (° C.) | a(Si) | $a^{FIT}$(Si) | ξ(T) | η(T) | $n_0$ (Å) | $c_0$ (Å) | a (Å) (% strain) | c (Å) (% strain) | FILM F (%) | BULK $F_0$ (%) |
|---|---|---|---|---|---|---|---|---|---|---|
| 20  | 5.4307 | 5.4307 | −0.553 | 1.11392 | 3.1692 | 3.5302 | 3.1843 (0.48%) | 3.5209 (−0.26%) | 0.491 | 0.983 |
| 200 | 5.4338 | 5.4343 | −0.557 | 1.11397 | 3.1729 | 3.5345 | 3.1850 (0.38%) | 3.5270 (−0.21%) | 0.533 | 0.933 |
| 400 | 5.4378 | 5.4384 | −0.563 | 1.11403 | 3.1779 | 3.5403 | 3.1859 (0.25%) | 3.5353 (−0.14%) | 0.575 | 0.875 |
| 600 | 5.4422 | 5.4425 | −0.569 | 1.11409 | 3.1816 | 3.5445 | 3.1868 (0.16%) | 3.5412 (−0.09%) | 0.625 | 0.812 |
| 800 | 5.4466 | 5.4466 | −0.575 | 1.11415 | 3.1857 | 3.5493 | 3.1879 (0.07%) | 3.5479 (−0.04%) | 0.675 | 0.758 |
| 900 | 5.4488 | 5.4486 | −0.578 | 1.11418 | 3.1877 | 3.5517 | 3.1887 (0.03%) | 3.5511 (−0.02%) | 0.691 | 0.733 |

Figure 6:
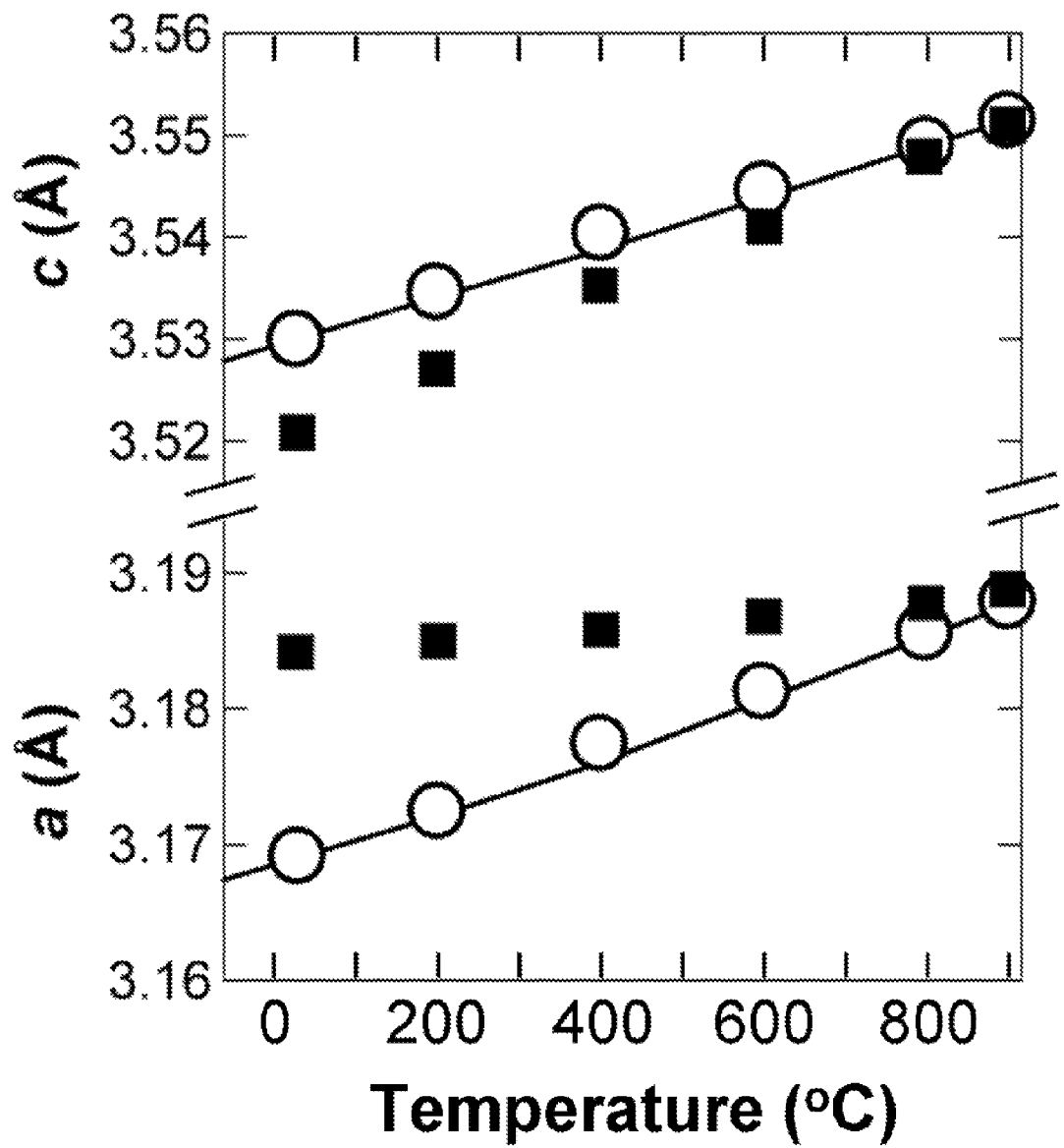
FIG. 6 compares the temperature dependence of the measured a- and c-axis lattice parameters of the $ZrB_2$ film (solid squares) to calculated relaxed values (open circles) and bulk data from the literature (solid lines).

To verify that these puzzling results are not due to phase inhomogeneities in the thick film samples or to measurement errors, FIG. 6 shows the measured a and c parameters for the 400 nm film, the calculated relaxed values $a_0$ and $c_0$, and the lattice parameters (solid lines) for bulk $ZrB_2$ as a function of temperature. As in the case of the 200 nm sample, the agreement between the relaxed parameters for the 400 nm sample and the bulk values is excellent, confirming that the thermal behavior of the film should be understandable in terms of the elastic properties of standard $ZrB_2$ crystals.

The observation of virtually no strain at the growth temperature suggests a bulk-like behavior for thicker samples. However, if the 400 nm film was behaving in a bulk-like fashion its thermal expansion as it cools down should be closer to that of bulk $ZrB_2$, but the opposite is observed: whereas for bulk $ZrB_2$ there is a $|\Delta c|/a = 0.58\%$ contraction between 900° C. and 20° C., the contraction is 0.40% for the 200 nm film and 0.14% for the 400 nm film. An examination of the temperature dependence of the coincidence misfit provides some insight into the behavior of the thick film: at the growth temperature, the film is essentially relaxed, even at the expense of a larger coincidence misfit F than in the 200 nm sample. However, it appears that upon cooling the film takes up strain as a way to minimize the coincidence misfit. Eventually, at room temperature, the coincidence misfit has been reduced to the same value as in the 200 nm film.

The above observations cannot be explained in terms of a strain energy equilibration model that includes only the Si substrate and the $ZrB_2$ film. Even if one were to assume that additional misfit dislocations relax the growth-temperature strain in the 400 nm film, such an assumption would not lead to a simple explanation of the temperature dependence of its lattice parameters. It appears that an explanation should allow for the possibility that a thin interfacial layer with its own elastic properties and strain status plays a role in the energy minimization.

The initial nucleation of $ZrB_2$ on Si (111) involves a $\sqrt{3} \times \sqrt{3}$ Si surface reconstruction with B atoms in a sub-surface layer and growth proceeds through the "6/5" coincidence mechanism ("magic" mismatch, supra). The atomic structure of the interfacial layer is different from crystalline Si and $ZrB_2$, and cannot be modeled with bulk material properties. The different behaviors of the 200 nm and 400 nm films, as well as the observation that all films have the same room temperature strain, regardless of thickness, are likely to require an interfacial layer with strongly anharmonic elastic properties in which the elastic constants are temperature-dependent, and perhaps even vary non-linearly.

Experimentally, the atomic positions in the nanometer-size interfacial region cannot be determined from our HR-XRD measurements. However, significant strain fields running into the silicon were clearly visible in HR XTEM micrographs obtained from these samples. In fact, a common problem encountered in the preparation of thin specimens for cross sectional TEM examination, was delamination of the thick film from the substrate, which was presumably caused by the large strains in the silicon within the interface region.

Figure 7:
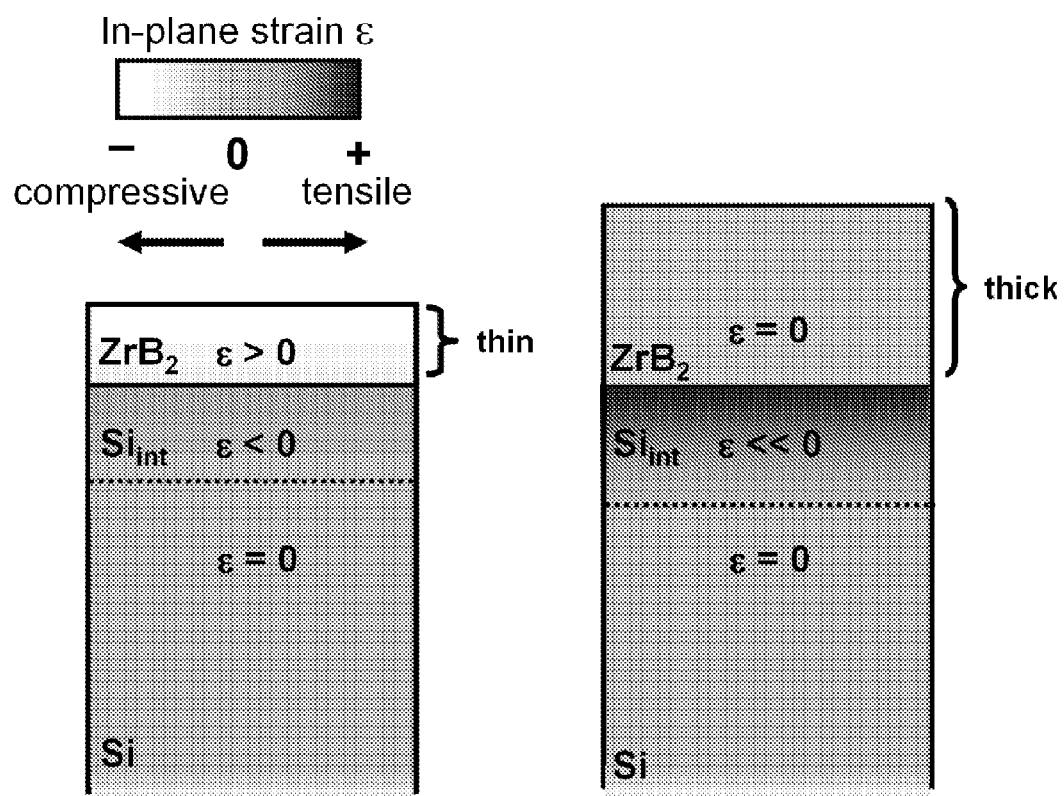
FIG. 7 is a schematic representation of the strain distribution in the thin and thick $ZrB_2$/Si heterostructures at the growth temperature of 900° C.

Without being limited any one theory of operation, a schematic illustration of the strain distributions in the thin and thick $ZrB_2$ films at the 900° C. growth temperature, including the interfacial layer, is shown in FIG. 7. In the case of the thick, relaxed film, the $ZrB_2$ applies a larger compressive stress on the interfacial layer, as shown by the "fade to black" contrast at the $ZrB_2$—Si interface in the right panel. The minimization of this stress may be the reason for the larger than expected room temperature strain in the thick film, as indicated above. From a microstructural perspective the strain mismatch is accommodated by a fixed number of edge dislocations at the interface, consistent with the ~6/5 coincidence, which "pin" the epilayer to the substrate to partially relieve the large misfit strain between the two materials. Thus the strains in $ZrB_2$ are determined by the thin initiation layer in the early stages of film growth (at 900° C.), and this layer then serves as a robust template for subsequent film growth. Because of the high mechanical stiffness of the $ZrB_2$ lattice, the registry adopted by this initial layer subsequently determines the strain state of the rest of the $ZrB_2$ film at the growth temperature. In this study, it has been shown that this strain depends on thickness, and that once a zero strain state is obtained there is in principle no upper limit to the thickness that can be achieved on Si.

Figure 8:
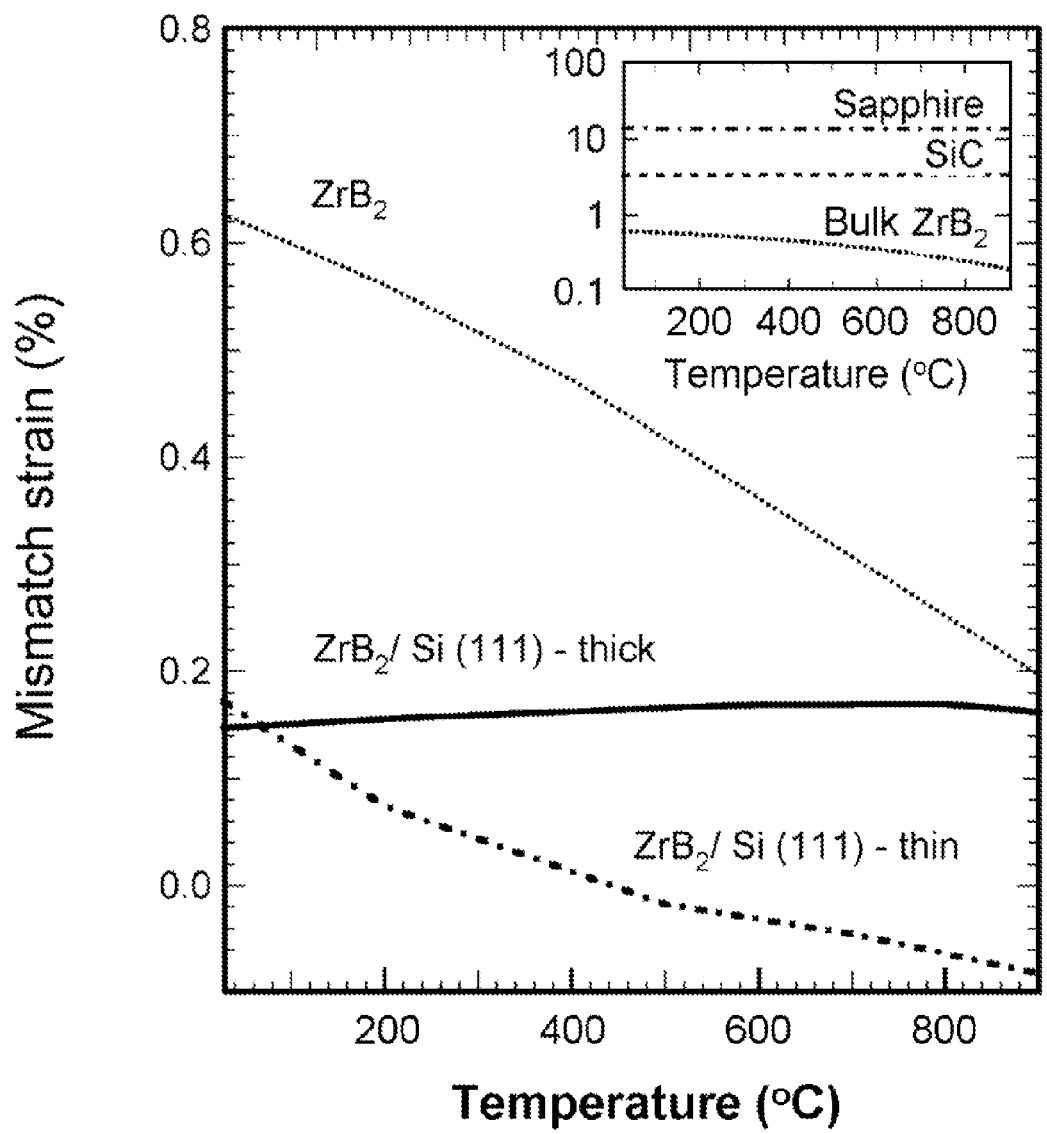
FIG. 8 is a comparison of the temperature dependence of the mismatch strains of GaN with $ZrB_2$/Si(111) films and bulk $ZrB_2$ substrates.

The thermal strain behavior observed in $ZrB_2$ films has significant implications for the use of these materials as buffer layers for nitride integration with Si. The temperature dependence of the mismatch strains between GaN and typical candidate substrates, including sapphire, SiC and bulk $ZrB_2$ are compared with $ZrB_2$/Si(111) in the inset of FIG. 8. As shown here both sapphire and SiC exhibit constant mismatch strain over the entire temperature range due to the large difference in lattice parameters between these substrates and GaN. For bulk $ZrB_2$ however, a systematic and significant decrease in mismatch strain is observed with increasing temperature. This indicates that although there is better lattice matching between bulk $ZrB_2$ and GaN relative to SiC and $Al_2O_3$, the nearly 10-fold thermal variation of mismatched strain in the former could lead to cracking or other structural degradation in devices. By contrast the hybrid substrate based on 200 nm thick $ZrB_2$ film grown on Si(111) possesses the smallest mismatch strain, which vanishes at ~400° C. and actually becomes negative at high temperatures (see main panel of FIG. 8).

To our knowledge, this system represents the first "zero mismatch" template for GaN integration, exhibiting the smallest absolute value of strain over the entire temperature among the substrates considered. For the 400 nm thick film the strain is also very small relative to the other candidate substrates and exhibits essentially no temperature dependence (see FIG. 8), indicating that this GaN/ZrB$_2$/Si(111) heterostructure based on thick ZrB$_2$ templates would experience the smallest degree of thermal stress. Overall, these data demonstrate the superiority of our buffer approach for practical integration of nitrides with silicon on both structural and thermoelastic grounds.

Example 4

Optical Properties of ZrB$_2$ Layers

A more detailed account of both the measurement and theoretical simulation of the ZrB$_2$ dielectric function $\in(\omega)$ and its reflectivity R($\omega$) in the energy range from ~0.2-7 eV was investigated to identify the origin of various characteristic spectral features in the reflectivity plot from the 1-7 eV range, and elucidate the low-energy (<1 eV) infrared properties, which are related to ZrB$_2$ metallic behavior.

Example 4a

Electronic Structure Calculations of ZrB$_2$ Layers

State-of-the-art density functional theory calculations of the electronic structure were carried out using the full-potential linearized augmented plane wave method (FPLAPW), as implemented in the EXCITING code. The Perdew-Zunger parameterization of the exchange-correlation potential and energy density of the Ceperley-Alder electron gas functional were employed. (Perdew and Zunger, *Phys. Rev. B* 23, 5048 (1981); Ceperley and Alder, *Phys. Rev. Lett.* 45, 566 (1980)) At room temperature ZrB$_2$ crystallizes in the AlB$_2$-type structure (space group P6/mmm) with lattice constants a=3.186 Å and c=3.521 Å, and atomic positions (in lattice coordinates) Zr: (000), B: (⅓⅔½), (⅔⅓½). Static lattice optimization of the cell parameters at the LDA level using the FPLAPW method corroborates this equilibrium structure but yields slightly contracted lattice constants (a=3.145 Å, c=3.487 Å) corresponding to an underestimate of 3.5% in the volume per formula unit. Part of this discrepancy is associated with the neglect of zero-point energy and vibrational entropy effects, which are beyond the scope of the present study. To ensure meaningful comparisons between the measured and simulated optical properties, all of our simulation studies were carried out at the room temperature experimental structure of ZrB$_2$.

Well-converged self-consistent ground state solutions of the Kohn-Sham equations were obtained in the FPLAPW basis using $R_{MT}K_{MAX}$=7 (product of the atomic sphere radii and the interstitial plane-wave cutoff), a maximum G-vector ($G_{MAX}$) of 12.0 in the expansion of the interstitial density and potential, and an angular momentum cut-off of $l_{MAX}$=10 for the corresponding density and potential within the atomic spheres, whose radii were set to 2.0 and 1.45 a.u. for Zr and B, respectively. Brillouin zone integration was carried out using the tetrahedron method on a 12×12×12 Γ-centered grid, corresponding to 133 k-points in the irreducible wedge.

Figure 9:
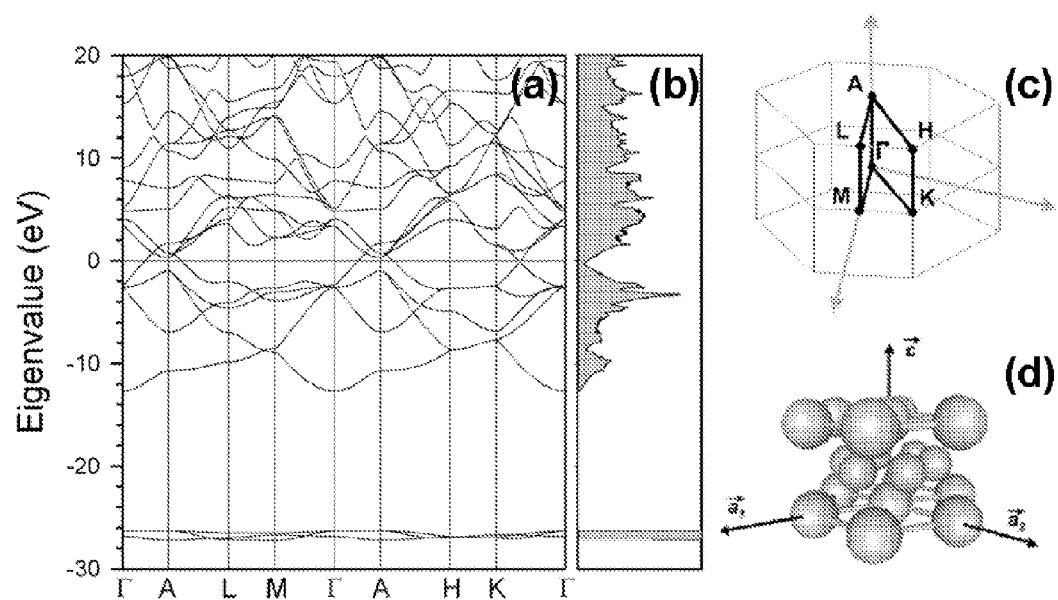
FIG. 9((b) shows the density of states of $ZrB_2$ indicating semi-metallic character.

The band structure of ZrB$_2$, and the corresponding total density of states (DOS) are shown in FIG. 9. The figure also contains a schematic of the unit cell structure, and a sketch of the Brillouin zone and high symmetry path used to plot the band dispersion. Perhaps the most distinct feature of the electronic structure is the "pseudogap", which appears as a valley in the DOS around the position of the Fermi level ($E_F$).

Figure 10:
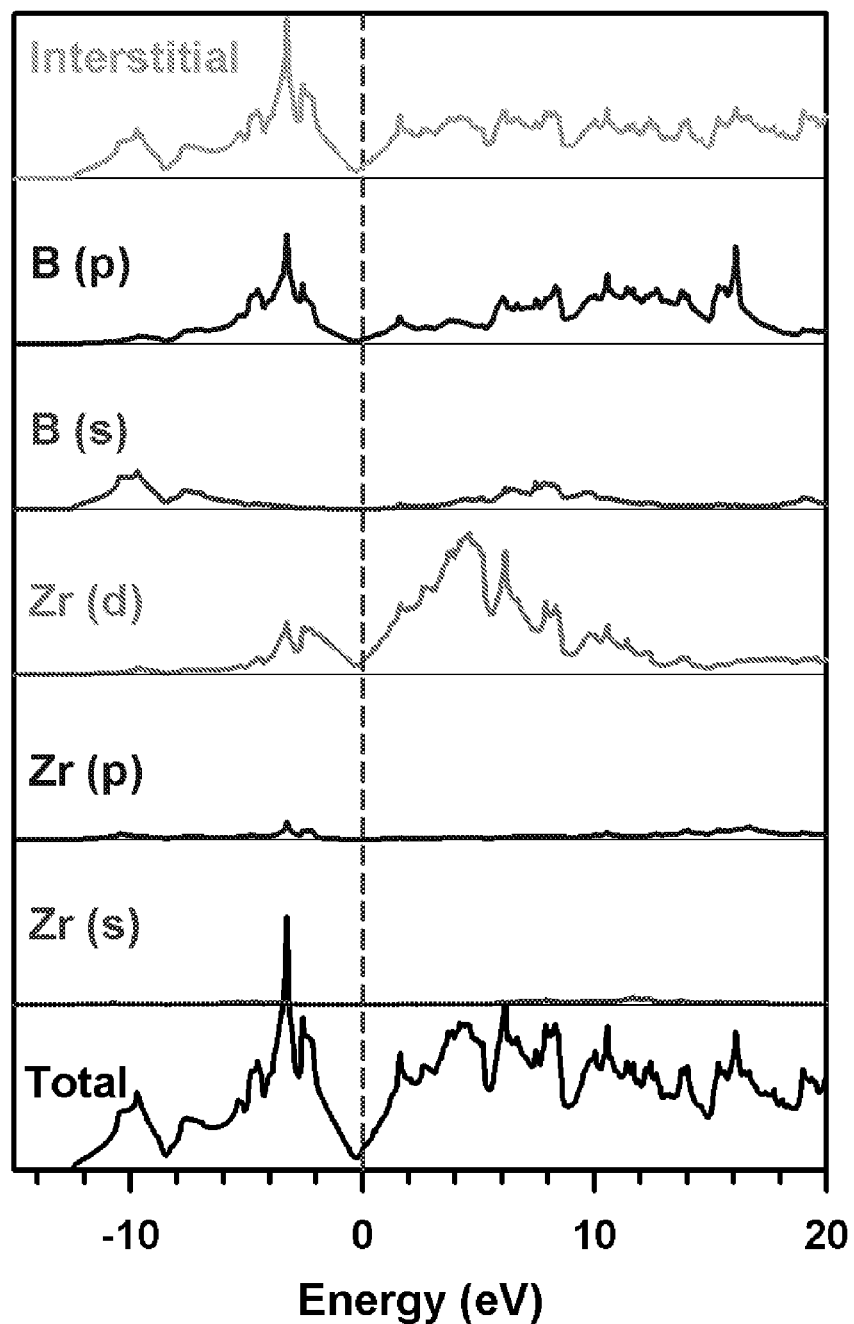
FIG. 10 shows the decomposition of the density of states by site (Zr,B) and by angular momentum character; the top-most panel is a plot of the interstitial contribution.

Besides conferring semi-metallic properties to ZrB$_2$ it has been suggested that the relatively low DOS near $E_F$ leads to weak electron-phonon coupling in this binary compound. The species and angular momentum decompositions of the DOS (partial DOS) are shown in FIG. 10, which indicate that the valence band structure is of a mixed hybrid nature devolving primarily from an admixture of B p-states and Zr d-states. The lowest lying bands in this energy range are largely Boron s-like, and account for the ~4 eV wide feature near −10 eV. The DOS in the conduction band is dominated by contributions from the Zr d-states up to 10 eV above $E_F$, while Boron p-states account for the features at higher energies as shown in the Figure.

All of the simulated optical properties described in the present work are obtained from the complex dielectric function $\in(\omega)=\in_1(\omega)+i\in_2(\omega)$. In the case of semi-metallic ZrB$_2$ both interband and intraband transitions contribute to the dielectric response, with the latter dominating at low energies. Three particle interactions between electrons, photons and phonons can also in principle produce indirect interband and intraband electronic transitions. While the incorporation of these effects is beyond the scope of the present work it is believed that they essentially contribute a smooth background to the spectral response (Smith, *Phys. Rev. B*, 3 1862 (1971)). In this work, only direct interband and intraband transitions were explicitly included. The interband component of the imaginary part $\in_2(\omega)$ of the dielectric function is obtained within the random phase approximation (RPA) as $$\varepsilon_2(\omega) = \frac{\hbar^2 e^2}{\pi m^2 \omega^2} \sum_{n,m} \int dk |p_{n,m,k}|^2 [f(E_{n,k}) - f(E_{m,k})] \delta(E_n(k) - E_m(k) - \hbar\omega) \quad [1]$$

where $p_{n,m,k}$ are the momentum matrix element for the transition from bands n and m at wave-vector k, with corresponding band energies $E_n(k)$ and $E_m(k)$, and f(E) are occupation numbers. The real part $\in_1(\omega)$ is then obtained from a Kramers-Kronig integration:

$$\varepsilon_1(\omega) = 1 + \frac{2}{\pi} P \int_0^\infty d\omega' \frac{\omega' \varepsilon_2(\omega')}{(\omega'^2 - \omega^2)}. \quad [2]$$

To model the contribution from direct intraband transition, the Drude expression $\in^{Drude}(\omega)=1-\omega_p^2/(\omega^2+i\omega\Gamma)$, where Γ is the lifetime broadening (Γ~0.11 eV, corresponds to a relaxation time of ~7 fs, see below) and $\omega_p$ is the free-electron plasma frequency, given by the expression:

$$\omega_p^2 = \frac{\hbar^2 e^2}{\pi m^2} \sum_n \int dk |p_{n,n,k}|^2 \delta(E_{n,k} - E_F). \quad [3]$$

were adopted. For binary crystals with hexagonal symmetry, like ZrB$_2$, the optical response is in general anisotropic with two independent components for $\in(\omega)$ and $\omega_p$ corresponding to electric field polarizations E∥c and E⊥c. These are obtained by evaluating the matrix elements appearing in Eq. 1-3 using appropriate momentum operator components.

It should be noted that a very dense 40×40×40 k-point mesh (3234 irreducible k-points) was required to converge the linear optical properties, including the plasma frequency.

The number of empty states in the optics calculations was increased to capture higher energy transitions that may be involved in the optical spectrum. Using the latter grid $\omega_p^{xx}=4.29$ eV and $\omega_p^{zz}=4.06$ eV were obtained for the plasma frequencies in basal plane and parallel to the c-axis, and an isotropic average value of 4.21 eV. This is smaller than an earlier reported value 4.56 eV obtained using a coarser grid of 2130 k-points. Once convergence was achieved, the normal incident reflectivity for both polarizations was calculated from the dielectric functions defined above using the Fresnel equation $$R = \frac{(n-1)^2 + k^2}{(n+1)^2 + k^2} \quad [4]$$

where n and k are the real and imaginary part of the complex refractive index defined by $n+ik=\sqrt{\in}$. The isotropic values of the dielectric functions, plasma frequencies and reflectivities (see below) were obtained taking an average according to $\langle N \rangle = \frac{1}{3}(2N_a + N_c)$, where $N_a$ and $N_c$ are quantities corresponding to the basal plane and c-axis, respectively.

Example 4b

Optical Properties from Ellipsometry of $ZrB_2$ Layers

Spectroscopic ellipsometry measurements were carried out at room temperature using a Variable-Angle Spectroscopic Ellipsometer with a computer-controlled compensator, and an Infrared Variable Angle Spectroscopic Ellipsometer (IR-VASE) with a rotating compensator (see, Herzinger et al., *J. Appl. Phys.* 83 (6), 3323-3336 (1998)). This system is based on a Fourier-Transform Infrared Spectrometer. Both instruments are manufactured by J. A. Woollam Co. We studied in detail two $ZrB_2$ samples with different thickness (~50 nm and 150 nm). Using the visible-UV instrument, the dielectric function of the films was determined from 0.74 eV to 6.6 eV with 0.03 eV steps. Two angles of incidence (70° and 80°) were used. Infrared measurements at an angle of incidence of 60° were carried out for the 150 nm sample. These measurements covered the 0.03 eV to 0.83 eV range.

The $ZrB_2$ films were modeled as a three-layer system consisting of a Si substrate, a film layer and a surface layer. Since $ZrB_2$ is optically absorbing, there is a strong correlation between thickness of the film and optical constants (McGahan, et al. *Thin Solid Films* 234 (1-2), 443 (1993)). In order to extract reliable optical data, the surface layer was modeled as a thin film consisting of 50% $ZrB_2$ and 50% voids in the Bruggeman approximation (see, Craig F. Bohren and Donald R. Huffman, *Absorption and Scattering of Light by Small Particles*. (Wiley Interscience, New York, 1983), p. 530). The thicknesses of the surface films were taken as twice the surface roughness RMS value, as obtained from the AFM measurements, and were kept fixed in the fitting process. The thicknesses of the $ZrB_2$ films were taken as equal to the thickness determined from the RBS measurements minus the AFM roughness RMS value, and they were also kept fixed. Finally, the optical constants for the Si substrate were taken from the literature (Herzinger, et al., *J. Appl. Phys.* 83 (6), 3323-3336 (1998)). These assumptions fix all parameters of the optical model except for the optical constants of $ZrB_2$, which are then obtained from a point-by-point fit (see, Perucchi, et al. *Phys. Rev. Lett.* 92 (6), 067401 (2004)).

The model assumes an isotropic dielectric function tensor, which is not required by symmetry in $ZrB_2$ but is justified as a good approximation by the theoretical simulations described above which predict that the anisotropy in the reflectivity is essentially zero over most of the energy range considered, with a maximum deviation of <10%. The self-consistency of the fit was verified by keeping the point-by-point optical constants fixed, while allowing the thicknesses of the two top layers (diboride and surface) to vary. The fit converged to the same values of thicknesses for surface layer and film layer that were assumed based on the AFM and RBS data. The optical constants obtained from the two samples were virtually the same. Since the films thicknesses are very different, this lends further support to the reliability of the fits. The maximum deviation between the two samples for the real part of the refraction index is $\Delta n=0.2$ in the UV while for the imaginary part, the deviation is $\Delta k<0.1$. The reflectivity of the two samples obtained using the above procedure was virtually identical. Finally, the Kramers-Kronig consistency of the optical constants was confirmed by verifying that the point-by-point fit dielectric function can be accurately described with an optical dispersion model consisting of Gaussian oscillators.

Figure 11:
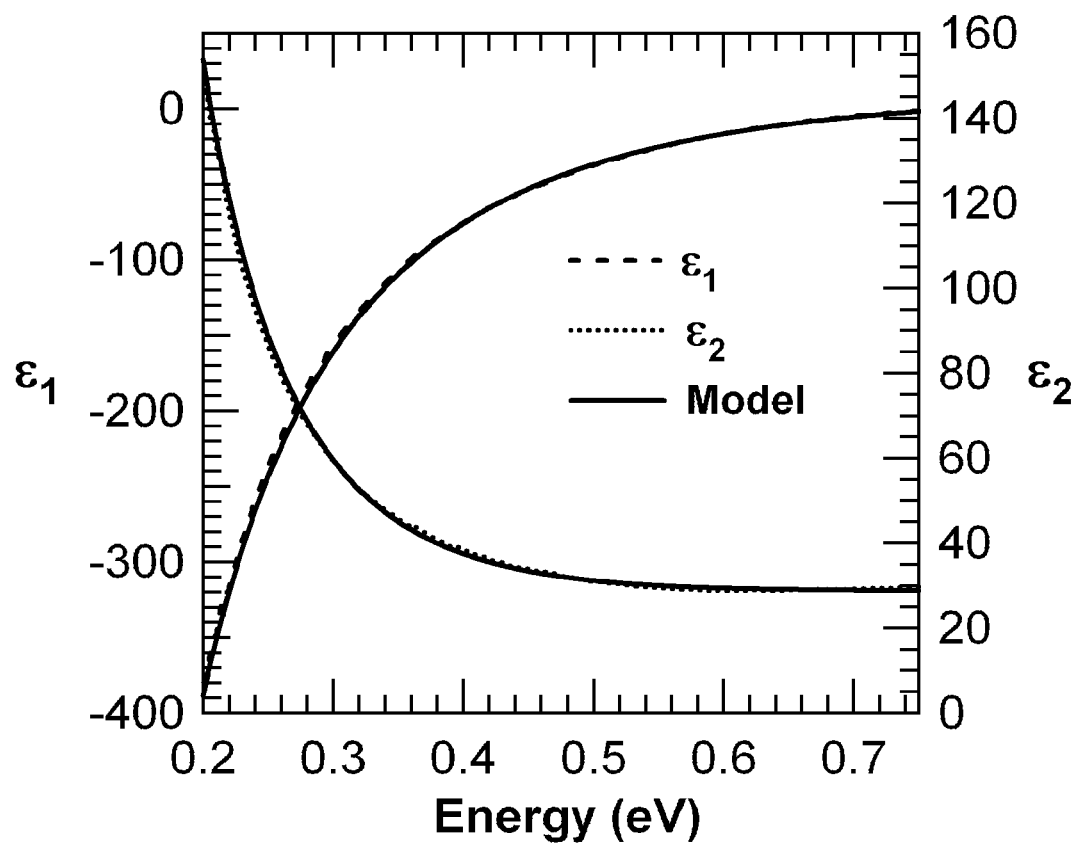
FIG. 11 is a graph illustrating the real ($\in_1$) and imaginary ($\in_2$) parts of the infrared complex dielectric function of $ZrB_2$ films grown on Si(111).

The real and imaginary parts of the complex dielectric function in the infrared are shown in FIG. 11. As can be seen from this figure, the dielectric function displays the typical metallic Drude behavior in the infrared. The data is fit with an expression of the form $$\in(\omega)=1+\in^{Drude}(\omega)+\in^{inter}(\omega). \quad [5]$$

Here $\in^{inter}(\omega)$ corresponds to interband transitions, which are modeled as Gaussian oscillators, and the Drude term is given in terms of the plasma frequency $\omega_p$ and the relaxation time T (or, alternatively, in terms of the DC resistivity $\rho_{dc}$ and $\tau$) as $$\varepsilon^{Drude}(\omega) = -\frac{\omega_p^2}{\omega^2 + i\omega/\tau} = -\frac{4\pi}{\rho_{dc}(\omega^2\tau + i\omega)}. \quad [6]$$

The plasma frequency can be expressed as $\omega_p^2=4\pi n e^2/m_{opt}$, where n is the conduction electron density and $m_{opt}$ is the average optical mass. The fit parameters are $\hbar\omega_p=4.22$ eV and $\tau=9.0$ fs. The value of the plasma energy is in excellent agreement with the FPLAPW-LDA prediction of 4.21 eV. From these parameters we find $\rho_{dc}=30.6$ μΩcm. Transport measurements in single $ZrB_2$ crystals yield a room temperature resistivity $\rho_{dc}$ (300K)=6-10 μΩcm, which implies $\tau$~30-45 fs, and a residual low-temperature resistivity $\rho_0=0.5-2$ μΩcm (see, Gasparov, et al., *Phys. Rev. B* 73 (9), 094510 (2006),); Forzani et al., *European Physical Journal B* 51 (1), 29 (2006)). A comparative analysis of the film and bulk results in the spirit of Matthiesen's rule suggests for our film samples a residual low temperature resistivity $\rho_0=21-25$ μΩcm, about one order of magnitude higher than in bulk single crystals. We emphasize, however, that we are comparing optical data from films with transport measurements in bulk crystals. Discrepancies have been noted between transport and optical measurements of the DC resistivity in systems with an optical response characterized by more than one Drude term. The $ZrB_2$ material could be such an example, since it has a complex conduction band structure with several charge pockets at the Fermi level.

The is fit very well with a single Drude term, the parameters of the Drude expression in Eq. 6 remain stable if the fit is limited to a very narrow low-frequency range), but the presence of an additional Drude term that might become apparent at extremely low frequencies (beyond the reach of our ellipsometer) cannot be ruled out. Ellipsometric measurements on bulk ZrB$_2$ single crystals should shed light on possible discrepancies between transport and optical data in this system.

If it is assumed that the optically derived resistivity can be compared with transport data, the higher resistivity of our material may result from its thin film nature. In fact, a similar effect is observed in the iso-structural MgB$_2$ compound, for which the residual resistivity in 400 nm-thick films grown on sapphire substrates is five times larger than in single crystal MgB$_2$ (see, Kim, et al., *Phys. Rev. Lett.* 87 (8), 087002 (2001); Masui, et el., *Phys. Rev. B* 65 (21), 214513 (2002).

The residual resistivity in bulk ZrB$_2$ crystals is very low compared to MgB$_2$, which magnifies the relative contribution of possible film defects. The only defects that we have observed in our ZrB$_2$ films are the strain relieving edge dislocations located at the interface. Threading analogs typically observed in mismatched heteroepitaxy are not present in our case. On the other hand, interface roughness scattering is known to make a significant contribution whenever the film thickness d is much less than the carrier mean free path l. (Guy Fishman and Daniel Calecki, *Phys. Rev. Lett.* 62 (11), 1302 (1989)).

Using de Haas-van Alphen data for ZrB$_2$ (see, Forzani, et al. *European Physical Journal B* 51 (1), 29 (2006)), a Fermi velocity $v_F$=1.2×10$^8$ cm/s was estimated which at room temperature leads to l~50 nm in the bulk material. Thus roughness scattering at the Si/ZrB$_2$ interface is not expected to be the main reason for the increased resistivity in our d=150 nm film. Similarly, the XRD discussion above suggests grain sizes of at least 500 nm, so that grain boundary scattering is not likely to play a dominant role.

Figure 12:
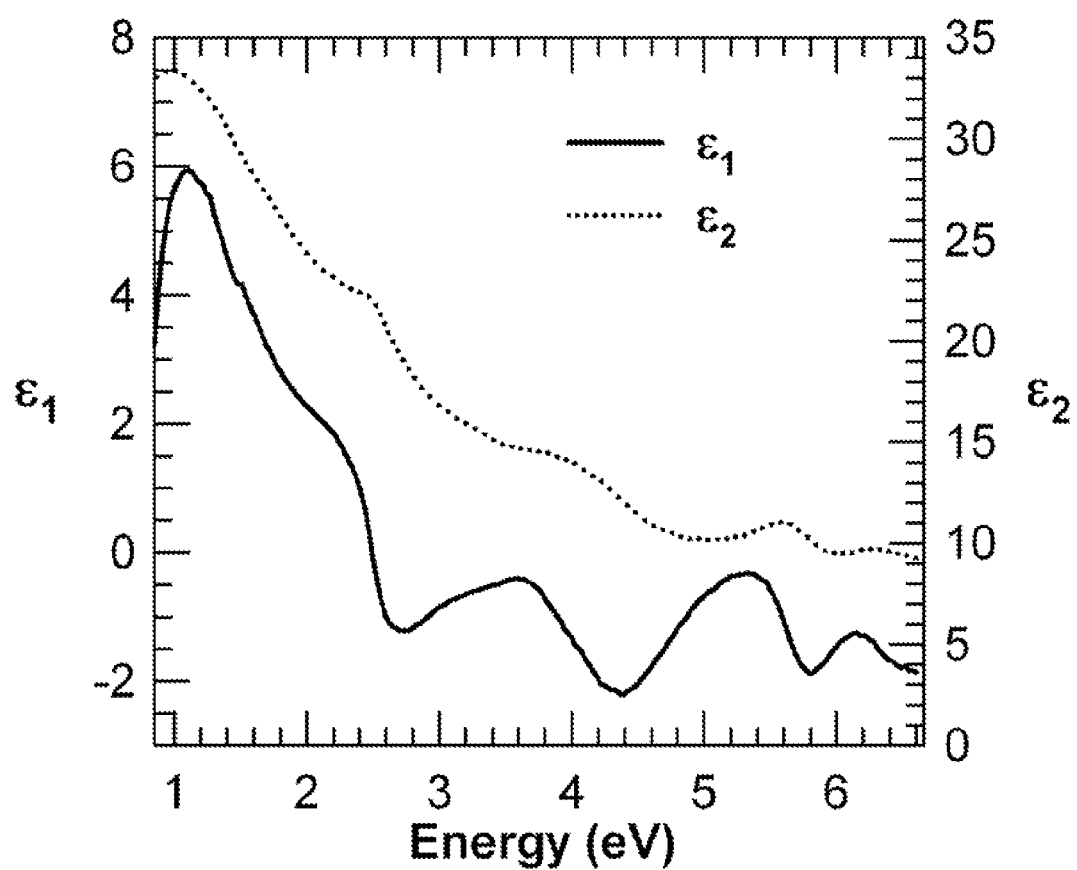
FIG. 12 is a graph illustrating the real ($\in_1$) and imaginary ($\in_2$) parts of the visible-UV complex dielectric function of $ZrB_2$ films grown on Si(111).

The real and imaginary parts of the dielectric function from the near-IR to the UV are shown in FIG. 12, and the correspondent air reflectivity (including the Drude region) is shown in FIG. 13. As mentioned above, the available optical data for ZrB$_2$ was the work of Oda and Fukui covering the 1.4-25 eV energy range, which is also plotted in FIG. 13 and compared with the instant data. A reasonable agreement is seen in the region below 3 eV, but at higher energies there is a rather abrupt drop in reflectivity in Oda and Fukui's data that is found neither in our experimental or simulated data (FIG. 13 solid and dotted line, respectively). On the other hand, both data sets agree well on the energy of the three features at 2.6 eV, 4.3 eV, and 5.7 eV, which are related to interband transitions.

The values of the visible/UV reflectivity shown here are slightly higher than those previously reported. The reason for the discrepancy may arise from that the thicknesses of the surface layer and the ZrB$_2$ film were allowed to vary in the fitting process, whereas here the RBS and AFM values have been chosen, as discussed above. The latter approach produces more consistent results when a common model is sought to fit ellipsometric measurements of ZrB$_2$ and Hf$_x$Zr$_{1-x}$B$_2$ alloys. The discrepancy between the two fitting procedures for ZrB$_2$ provides an estimate of the error in the ellipsometric determination of the dielectric function. However, neither the infrared reflectivity nor the energy of the visible/UV interband features are affected by the choice of fitting procedure.

FIG. 13 also compares the observed reflectivity with our LDA simulations. The dotted line represents the isotropic average reflectivity, while the inset is a plot of the anisotropy calculated as the difference between the reflectivity corresponding to an E-field perpendicular and parallel to the ZrB$_2$ c-axis, respectively. Simulations predict that the reflectivity is essentially isotropic ($R_\perp - R_\parallel \sim 0$) over most of the energy range from 0-10 eV, but that significant deviations on the order of 5-10% are expected near 4.4 and 9.5 eV. As can be seen from the comparison the theoretical reflectivity reproduces the experimental data fairly well, including the positions of the main experimental spectral features labeled A (2.6 eV), B (4.3 eV) and C (5.7 eV) in the figure. The corresponding values from simulation are 2.2, 4.4 and 5.5-5.7 eV, respectively. For energies <1 eV the simulated results slightly underestimated the observed reflectivity using a calculated value of $\hbar\omega_p$=4.21 eV and a best fit value of $\tau$=7 fs. The slightly lower value for the lifetime obtained here is likely associated with the differences between the calculated and measured interband component to the reflectivity, which is non-empirical in the former case. The agreement between theory and experiment in the low energy range indicates that the single oscillator assumption used in the experimental fitting is a good approximation.

To fully elucidate the origin of the observed spectral features labeled A, B and C in FIG. 13 a detailed analysis of the electronic band structure was carried out. By systematically sorting the momentum matrix elements corresponding to interband transitions (see Eq. 1) according to both energy and k-point index band combinations were identified with dominant spectral weight for each of the three features. According to simulations these transitions do not occur at high-symmetry points in reciprocal space, but rather from narrow regions within the Brillouin zone as described by the segments below each panel corresponding to each feature in FIG. 14. Here the values of the parameters $\kappa_A$, $\kappa_B$ and $\kappa_c$ are given in terms of lattice coordinates in k-space:

$$k_1 = \frac{2\pi}{\left(\frac{a\sqrt{3}}{2}\right)}(1,0,0),\; k_2 = \frac{2\pi}{\left(\frac{a\sqrt{3}}{2}\right)}\left(\frac{1}{2}, \frac{\sqrt{3}}{2}, 0\right) \text{ and } k_3 = \frac{2\pi}{c}(0,0,1).$$

Figure 14:
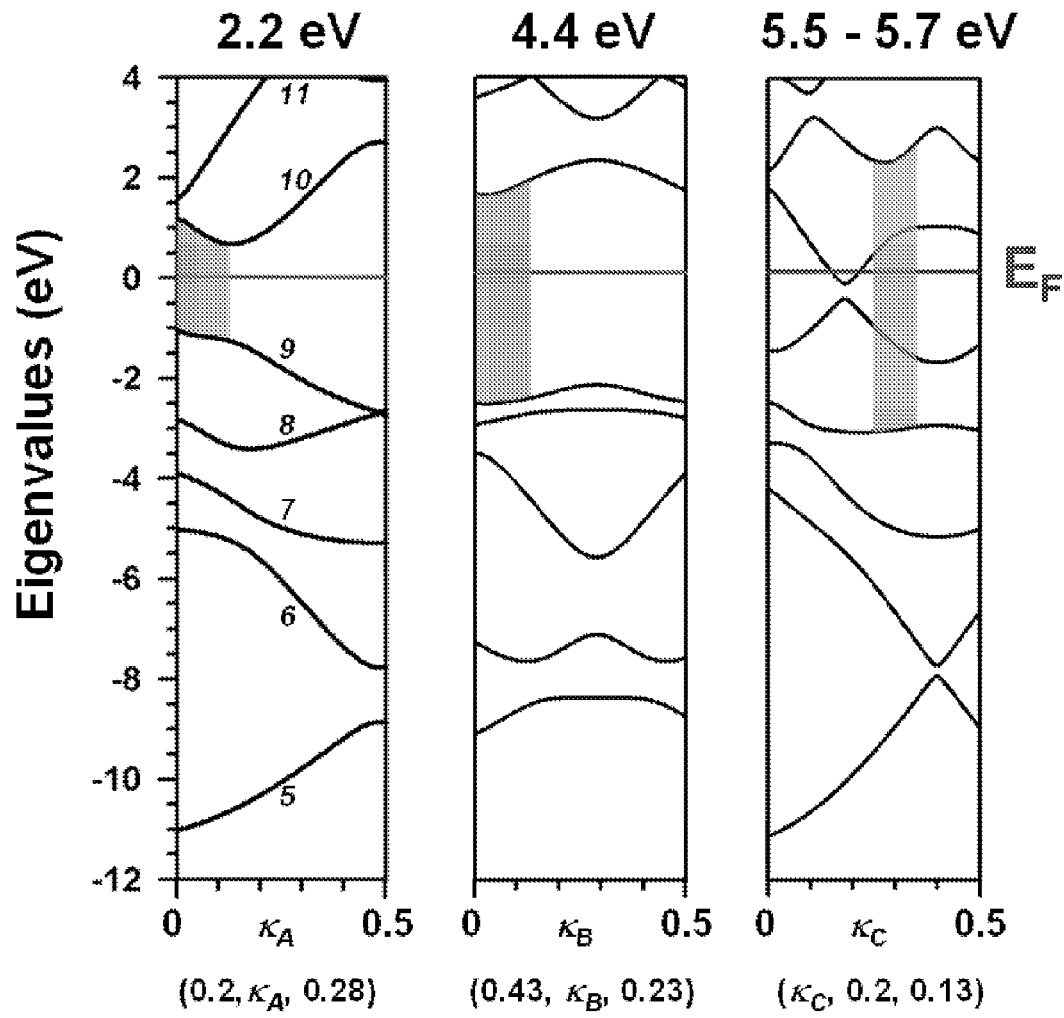
FIG. 14 is a graph of the band diagrams for $ZrB_2$ illustrating the electronic origin of the spectral features found in the reflectivity at 2.2, 4.4 and 5.5 eV; the shaded regions indicate interband transitions, and location in k-space, for which the momentum matrix element contributions to the spectral features are largest.

From these plots it is evident that features A and B at 2.2 eV and 4.4 eV, respectively, involve transitions from band 9 to band 10 while feature C in the vicinity of 5.5-5.7 eV involves direct interband transitions from band 8 to band 11 (see numbering in the band structure of first panel, FIG. 14). The grey areas shown in FIG. 14 denote the approximate range corresponding to the largest momentum matrix elements.

Example 5

ZrHfB$_2$ Alloys

High-quality heteroepitaxial Hf$_x$Zr$_{1-x}$B$_2$ (0<x<1) buffer layers have been epitaxially grown directly on Si(111). The compositional dependence of the film structure, and ab initio elastic constants, show that hexagonal Hf$_x$Zr$_{1-x}$B$_2$ alloy layers possess tensile in-plane strain (approximately 0.5%) as grown Si(111) substrates were outgassed in the MBE chamber at 650° C. and the native oxide was removed by flashing at 1200° C. The Hf(BH$_4$)$_4$ and Zr(BH$_4$)$_4$ gasses were then allow to react on the substrate surface at 900° C. and 1-20×10$^{-6}$ Torr (base pressure 10$^{-10}$ Torr) for approximately 30-120 minutes, depending on film thickness. Under these conditions both precursors thermally decomposed to form films according to:

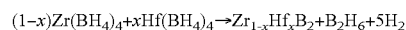

The relationship can be further generalized to include Aluminum and corresponding expressions that relate the precursors to the formation of films of Zr$_x$Hf$_y$Al$_{1-x-y}$B$_2$ (0≤x≤1, 0≤y≤1) and can be written accordingly. For example, the generated diborane as byproducts or BH$_4^+$ moieties, can react with atomic Al to produce solid AlB$_2$.

Figure 15:
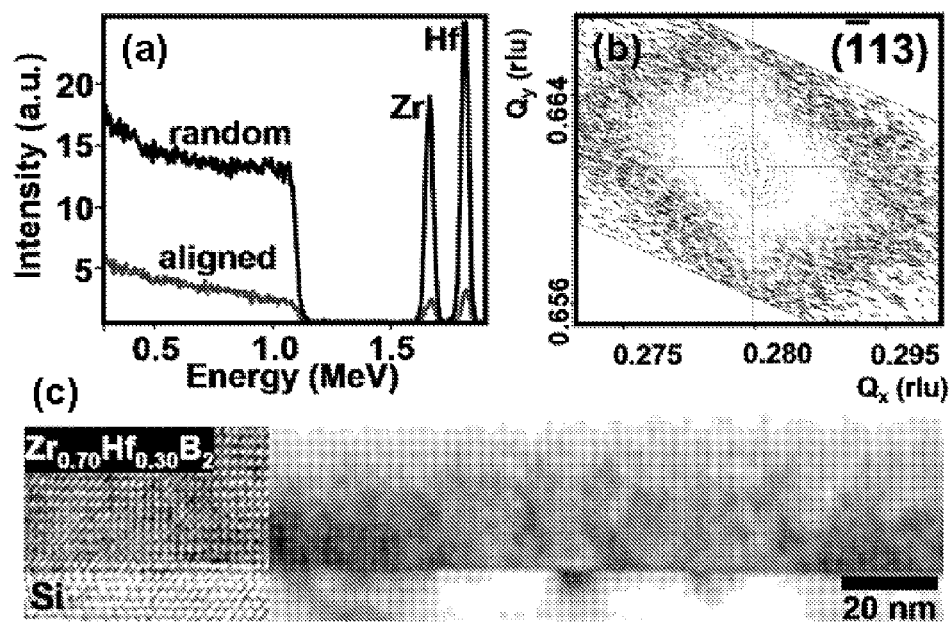
FIG. 15 (a) shows RBS spectra of a $Zr_{0.70}Hf_{0.30}B_2$ film grown directly on Si(111) in accordance with the invention.

FIG. 15(a) shows an RBS spectrum of a $Zr_{0.70}Hf_{0.30}B_2$ sample with a nominal thickness of 50 nm. The ratio of the aligned vs. the random peak heights ($\chi_{min}$) is 6% for both Hf and Zr, indicating their full substitutionality in the alloy and the high degree of epitaxial alignment of the film with respect to the Si substrate. XTEM indicates that the layers are perfectly monocrystalline, highly coherent and atomically flat (FIG. 15b and FIG. 15c).

The lattice misfit is taken up by pure edge-type dislocations via insertion of extra {1100} planes along the [1120] direction. Diffraction contrast micrographs reveal that no threading dislocation cores propagate to the surface within the field of view of approximately 3 µm. Electron energy loss spectroscopy (EELS) with a nanometer-sized electron probe shows that the constituent Zr and Hf elements appear together at every nanometer scale region probed without any segregation of the individual alloy components. Atomic force microscopy (AFM) revealed a smooth surface with a roughness of approximately 2 nm for a 5×5 µm² area which is highly suitable for buffer layer applications. The surface morphology further improves by ex situ annealing of the films at 900° C. and $10^{-9}$ Torr for 8 hours. This yields a roughness below 1.5 nm and a surface consisting of large atomically flat areas connected by steps.

For all $Zr_{1-x}Hf_xB_2$ films that have been characterized, HR-XRD on-axis scans show the (001) and (002) peaks of the $AlB_2$ structure, oriented with (0001) parallel to the Si(111). The $ZrHfAlB_2$ family of diborides has a layered structure which is referred to generally as "the $AlB_2$" structure. The (002) peaks, which are more sensitive to the compositional changes of the alloys, were significantly shifted from those of pure $ZrB_2$. The absence of splitting or broadening in these peaks corroborates the full substitutionality of both Hf and Zr atoms in the lattice. Thickness fringes were observed in the vicinity of the (001) and (002) reflections, confirming the high quality of the interface and the uniformity and smoothness of the layers. Accurate a and c lattice parameters were extracted from the asymmetric (−113) reciprocal space maps of the $AlB_2$ structure and are provided in Table 1 for samples with thicknesses of ~50±5 nm. Due to strain, these measured lattice parameters do not correspond to the relaxed hexagonal lattice parameters $a_0$ and $c_0$.

For hexagonal films with the [0001] plane oriented normal to the substrate, the perpendicular ($\in_c$) and parallel ($\in_a$) strains are given by $\in_c = -2C_{13}\in_a/C_{33}$ where $\in_c = (c-c_0)/c_0$ and $\in_a = (a-a_0)/a_0$. $C_{13}$ and $C_{33}$ are elastic tensors. For bulk $ZrB_2$ and $HfB_2$ the known c/a ratios (denoted by η below) are slightly different (1.114 and 1.108, respectively). Therefore, in order to determine the strain state the following approximations were made: (i) η for the relaxed epitaxial film is identical to that of the equilibrium bulk crystals and (ii) the c/a ratio (η) and elastic ratio $\xi = -2C_{13}/C_{33}$ are both linear functions of composition; $\eta(x) = x\eta HfB_2 + (1-x)\eta ZrB_2$ and $\xi(x) = x\xi HfB_2 + (1-x)\xi ZrB_2$, respectively. Since the elastic constants of both $ZrB_2$ and $HfB_2$ are generally not well known, the Vienna ab initio simulation package (VASP) DFT code (which is described by G. Kresse and J. Furthmiiller in Phys. Rev. B 54, 11169 (1996), and G. Kresse and J. Furthmiiller, in Comput. Mater. Sci. 6, 15 (1996), both of which are incorporated herein by reference) was used to calculate them using finite strain deformations of the equilibrated systems. Additional information about the theory of the elastic constants of hexagonal transition metal materials was given by Fast et al., in Phys. Rev. B 41, 17431 (1995), incorporated herein by reference. From inversion of the strain relation the relaxed lattice constants are then given by $a_0(x) = \{c(x)\eta(x) - \xi(x)a(x)\}/\{1-\xi(x)\}$ and $c_0(x) = \eta(x) \cdot a_0(x)$, and these are listed in Table 4 (infra). The relaxed film lattice constant of the end members match the known values for the bulk phases. This provides additional justification for the approximations discussed above.

The relaxed lattice constants for the alloys follow Vegard's law quite closely. Our analysis shows that $ZrB_2$ and the alloy films exhibit a slight tensile strain ($\in_a \sim +0.50\%$, $\in_c \sim -0.29\%$), while the $HfB_2$ film is strained even more ($\in_a \sim +0.66\%$, $\in_c \sim -0.36\%$). The fact that all of the films (including $ZrB_2$) were found to be tensile strained has significant implications for lattice engineering, since this provides better matching with Ga-rich alloys. In particular, the measured value of a for the $ZrB_2$ films is essentially identical to that of GaN.

Figure 16:
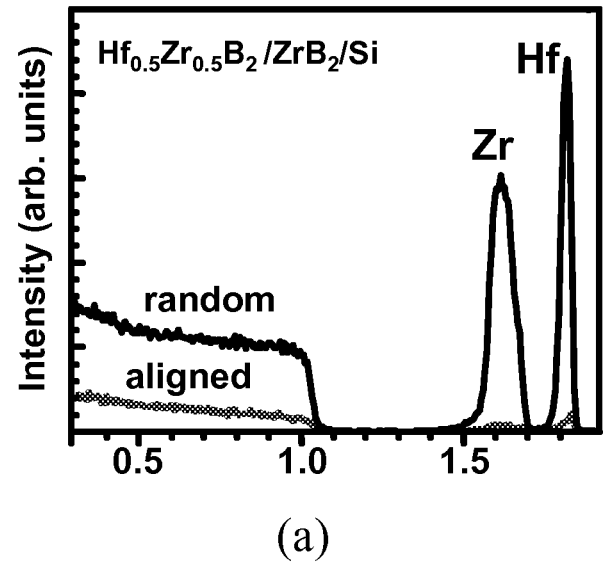
FIG. 16 (a) shows RBS spectra for $Hf_{0.5}Zr_{0.5}B_2$ alloy layer grown on a $ZrB_2$ buffer layer.
Figure 16:
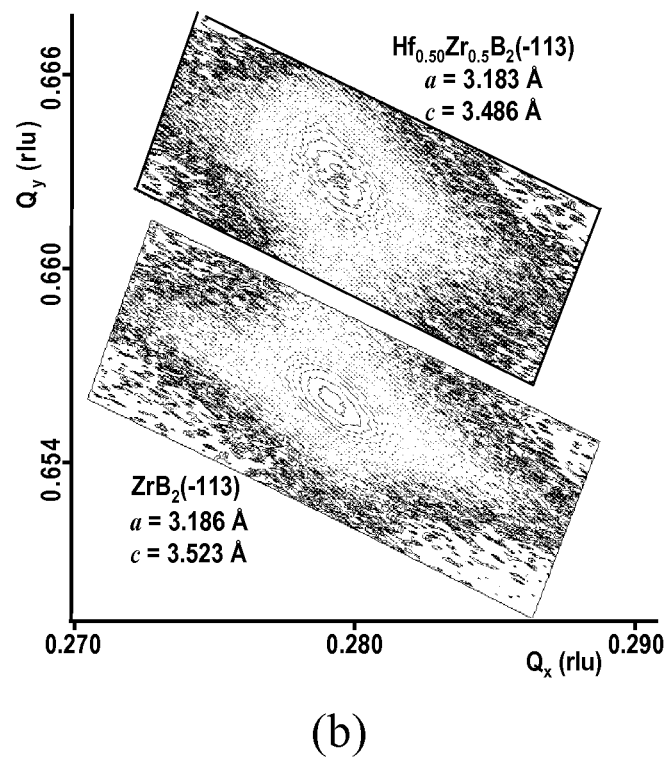

FIG. 16(a) shows Rutherford backscattering (RBS) spectra obtained for a 45 nm thick $Hf_{0.5}Zr_{0.5}B_2$ alloy grown on 85 nm thick $ZrB_2$ buffer layer. Both Zr and Hf show a high degree of alignment (low trace) which is consistent with high crystallinity and perfect epitaxial registry. FIG. 16(b) shows high resolution X-ray reciprocal space maps of the (−113) peaks of the $Hf_{0.5}Zr_{0.5}B_2$ and $ZrB_2$ buffer layer showing the precise lattice constant values within the heterostructure.

Example 6

Epitaxial $Zr_xHf_yAl_{1-x-y}B_2$ Layers

Exemplary films of $Zr_xHf_yAl_{1-x-y}B_2$ (0≤x≤1, 0≤y≤1) have been grown according to the methods of the preceding examples by the inclusion of an atomic Al source, and characterized by Rutherford backscattering (RBS), high resolution cross sectional transmission electron microscopy (XTEM), Z-contrast imaging, and high resolution x-ray diffraction (HR-XRD). These tunable structural, thermoelastic and optical properties suggest that $Zr_xHf_yAl_{1-x-y}B_2$ (0≤x≤1, 0≤y≤1) templates are suitable for broad integration of III nitrides with Si. As an example of embodiments, $Zr_xHf_yAl_{1-x-y}B_2$ (0≤x≤1, 0≤y≤1) films have been grown with y=0 (i.e. alloys of Zirconium and Hafnium).

Example 7

$HfB_2/ZrB_2/Si(111)$

High quality $HfB_2$ films were also grown on strain compensating $ZrB_2$-buffered Si(111). Initial reflectivity measurements of thick $ZrB_2$ films agree with first principles calculations which predict that the reflectivity of $HfB_2$ increases by 20% relative to $ZrB_2$ in the approximately 2-8 electron volt (eV) energy range. Wavelength (λ) (measured in micrometers (µm) is reciprocally related with energy (measured in eV) through the relationship $$\lambda(\mu m) = 1.24/\text{Energy (eV)}$$

As noted above, the in-plane strain systematically increases in the Hf-rich compositional regime with a concomitant reduction in growth rate (approximately 0.5 nm/min, for pure $HfB_2$). The increase in strain reduces the reactivity and surface mobility. In fact, for $HfB_2$ the growth on Si(111) eventually produces almost exclusively rough films with large surface undulations (AFM roughness, >15 nm). The growth, in this case, was conducted at 900° C. via decomposition of pure $Hf(BH_4)_4$ under conditions similar to those described above for the alloys. The RBS and XTEM data confirmed the presence of predominately rough layers dominated by ensembles of large islands. Nevertheless, and in spite of the slightly larger film strain (see Table 4), the data also showed stoichiometric and aligned materials with sharp and commensurate interfaces. XRD off axis measurements gave a=3.160 Å and c=3.467 Å which are larger/smaller than a=3.142 Å, c=3.48 Å of bulk $HfB_2$, due to strain imposed by the Si substrate.

Further, growth of $HfB_2$ films on isostructural $ZrB_2$ buffers (rather than on directly on the Si(111) surface) to promote formation of smooth films suitable for nitride integration were pursued. These $HfB_2$ films grow much more readily (~2 nm/min.), and exhibit exceptional morphological and structural properties, including flat surfaces (AFM roughness ~2 nm), highly coherent interfaces and virtually defect free microstructures. The XRD measurements show that the layers are partially strained and the lattice parameters are close to those of $HfB_2$ films grown on Si (Table 4).

TABLE 4

Lattice parameters of $Zr_{1-x}Hf_xB_2$ films obtained from HR-XRD analysis (bold font). The relaxed lattice parameters ($a_0$ and $c_0$) and calculated strains ($\epsilon_a$ and $\epsilon_c$) are obtained from a compositional interpolation of the elastic ratio $\xi(x)$ and bulk c/a ratio $\eta(x)$.

| X | 0 | 0.15 | 0.3 | 0.6 | 1 |
|---|---|------|-----|-----|---|
| A | 3.187 | 3.183 | 3.176 | 3.167 | 3.160 |
| $\epsilon_a$ | +0.52 | +0.54 | +0.50 | +0.48 | +0.66 |
| C | 3.521 | 3.513 | 3.505 | 3.491 | 3.467 |
| $\epsilon_c$ | −0.30 | −0.32 | −0.28 | −0.27 | −0.36 |
| $\xi(x)$ | −0.584 | −0.580 | −0.574 | −0.565 | −0.552 |
| $\eta(x)$ | 1.114 | 1.113 | 1.112 | 1.111 | 1.108 |
| $a_0$ | 3.170 | 3.166 | 3.160 | 3.152 | 3.140 |
| $C_0$ | 3.531 | 3.524 | 3.515 | 3.501 | 3.480 |

Figure 17:
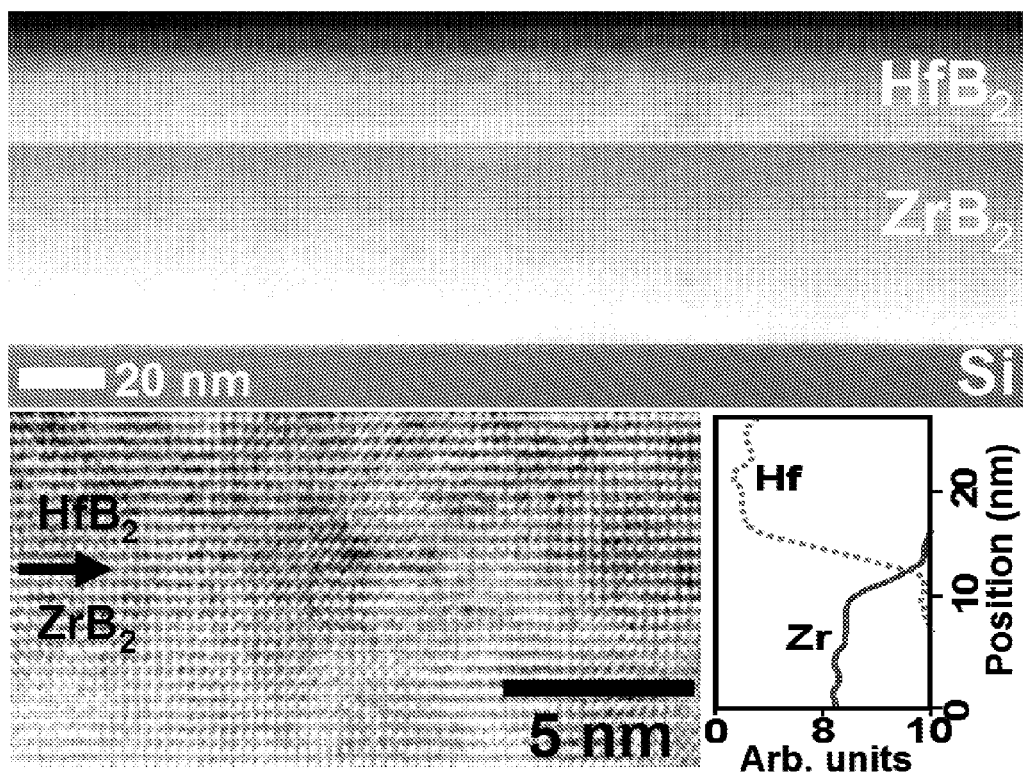
FIG. 17 shows (top) a Z-contrast image of a $HfB_2$/$ZrB_2$/Si (111) heterostructure and (bottom) a high resolution XTEM of the perfectly epitaxial $HfB_2$/$ZrB_2$ interface and corresponding EELS composition profile of Hf (M-edge) and Zr (L-edge)

Growth of thin $HfB_2$ layers on oxidized Si via decomposition of $Hf(BH_4)_4$, has been reported by Jayaraman et al., in Surf. Coat. Tech. 200(22-23), 6629 (2006), incorporated herein by reference, but no evidence of epitaxy was given. The XTEM data indicates that the $ZrB_2$ buffers bridge the strain differential between $HfB_2$ and Si, allowing formation of perfectly epitaxial $HfB_2$ films that cannot be obtained directly on Si. Thus a subsequent $ZrHfAlB_2$ diboride film can be epitaxially deposited on a $ZrB_2$ layer that is epitaxially deposited on the substrate to promote growth of the subsequent diboride film. XTEM Z-contrast images and EELS profiles of Zr and Hf across the interface showed an abrupt transition of the elements from $ZrB_2$ to $HfB_2$ with no evidence of intermixing between the two materials at the nanometer scale (FIG. 17).

Example 8

$Zr_{1-x}Hf_xB_2/ZrB_2/Si(111)$

The $Zr_{1-x}Hf_xB_2$ alloys with compositions across the entire homogeneity range were produced via reactions of the $Hf(BH_4)_4$ and $Zr(BH_4)_4$ precursors by gas source MBE. The growth was performed using procedures similar to those described above. Briefly, the freshly prepared $Hf(BH_4)_4$ and $Zr(BH_4)_4$ gaseous precursors were diluted with research grade $H_2$ at 2% by volume and stock mixtures were produced by mixing at the desired molar ratios which were found to determine the final composition of the alloy. Prior to each deposition, the mixtures were checked by gas IR which confirmed that the individual components did not react or decomposed even when kept for extended time periods. The Si(111) substrates were sonicated in methanol to remove organic impurities from the surface, and then loaded into the MBE chamber. They were outgassed at 650° C. until the pressure was restored to the base value ($10^{-9}$ Torr), and then flashed at 1200° C. to desorb the native oxide. The reactions were conducted at an temperature of 900° C. and at pressures ranging form $1\times10^{-6}$ to $2\times10^{-5}$ Torr for 2-5 hours depending on the target film composition and thickness.

The compositional and morphological properties of the samples were characterized using the same techniques as detailed above for the $HfB_2/ZrB_2/Si(111)$ system, and the data in general indicated materials with similar quality. Here we focus on the strain behavior of selected $Hf_xZr_{1-x}B_2/ZrB_2/Si(111)$ and $Hf_yZr_{1-y}B_2/Hf_xZr_{1-x}B_2/Si(111)$ samples (with y>x) obtained via measurements of the (113) reciprocals space maps. A typical example involves a $Hf_xZr_{1-x}B_2/ZrB_2/Si(111)$ sample consisting of an ~300 nm thick $Hf_{0.25}Zr_{0.75}B_2$ alloy grown on a 35 nm thick $ZrB_2$ buffer. The in-plane lattice constant of the buffer (3.1699 Å) is smaller than that (3.189 Å) observed in the as grown $ZrB_2/Si(111)$ sample with the same thickness implying that the $Hf_{0.25}Zr_{0.75}B_2$ overlayer has induced a compression in the underlying $ZrB_2$ template. The lattice constant of the $Hf_{0.25}Zr_{0.75}B_2$ (3.1692 Å) is significantly larger than its relaxed alloy value (3.160 Å) indicating that the overlayer is tensile strained. Overall these results show the general behavior that the epilayer compresses the much thinner buffer which in turn induces a tensile train on the epilayer. Consequently the entire $Hf_{0.25}Zr_{0.75}B_2/ZrB_2$ film is fully coherent and tensile strained with respect to the substrate.

The strain properties of this sample were compared to a related $Hf_{0.5}Zr_{0.5}B_2/ZrB2/Si(111)$ heterostructure in which the overlayer has a significantly higher Hf content and is also much thinner than the buffer (45 and 80 nm, respectively). The measured in-plane lattice constants are 3.183 Å and 3.186 Å, respectively, indicating that the two layers are essentially lattice matched.

In contrast to the previous sample, the epilayer in this case exhibits a larger lattice constant in spite of its higher Hf content while that of the buffer is essentially unchanged (a=3.189 Å) compared to its original strain state. This observation indicates that the thicker buffer imposes a significant tensile strain on the overlayer and the entire stack is tensile strained to the substrate. In both examples described here the strain state of the combined boride layers is intimately dependent on the thickness and composition of the individual layers, as expected.

Example 9

Optical Properties of $HfB_2/ZrB_2/Si$

Spectroscopic ellipsometry measurements were carried out on a $HfB_2/ZrB_2/Si$ sample prepared according to the preceding examples with a $HfB_2$ thickness of ~70 nm and a $ZrB_2$ thickness of ~70 nm as measured by RBS. The dielectric function was measured from 0.74 eV to 6.6 eV with 0.02 eV steps using three angles of incidence: 65°, 70° and 75°. Measurements between 0.03 eV to 0.83 eV were performed with the infrared ellipsometer using three angles of incidence: 60°, 65° and 75°. The $HfB_2/ZrB_2/Si$ stack was modeled as a five-layer system consisting of a Si substrate, a $ZrB_2$ buffer layer, an interface roughness layer, a film layer and a surface layer. As in the $ZrB_2$ case, the surface layer was modeled as a thin film consisting of 50% $HfB_2$ and 50% voids in the Bruggeman approximation. The thicknesses of the surface films were taken as twice the surface roughness rms value, as obtained from the AFM measurements, and were kept fixed in the fitting process. The thickness of the $HfB_2$ layer was taken as equal to the thickness determined from the RBS measurements minus the AFM roughness rms value. For the buffer layer we used the optical constants of $ZrB_2$ described in a previous publications. The optical constants of $HfB_2$, which were then obtained from a point-by point-fit. An isotropic dielectric function tensor was assumed.

Figure 18:
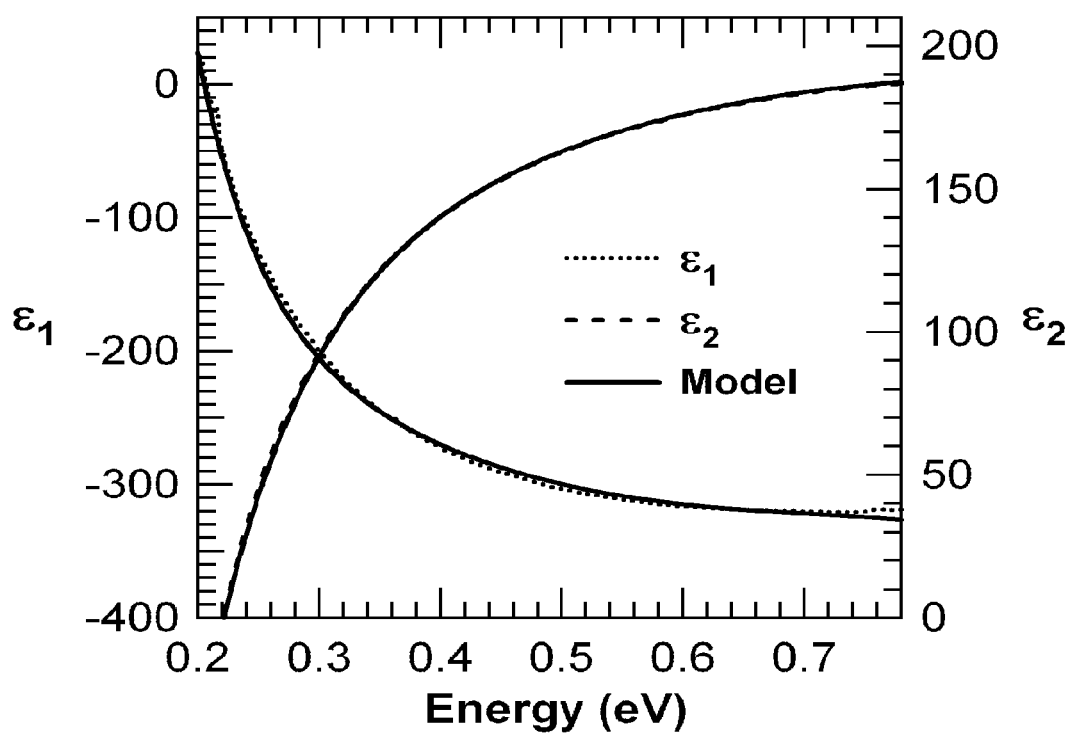
FIG. 18 Real ($\in_1$) and imaginary ($\in_2$) parts of the infrared complex dielectric function of $HfB_2$ films grown on Si(111) via $ZrB_2$ buffer layers. The dielectric function is obtained from a point-by-point fit of the ellipsometric data, as described in the text.
Figure 19:
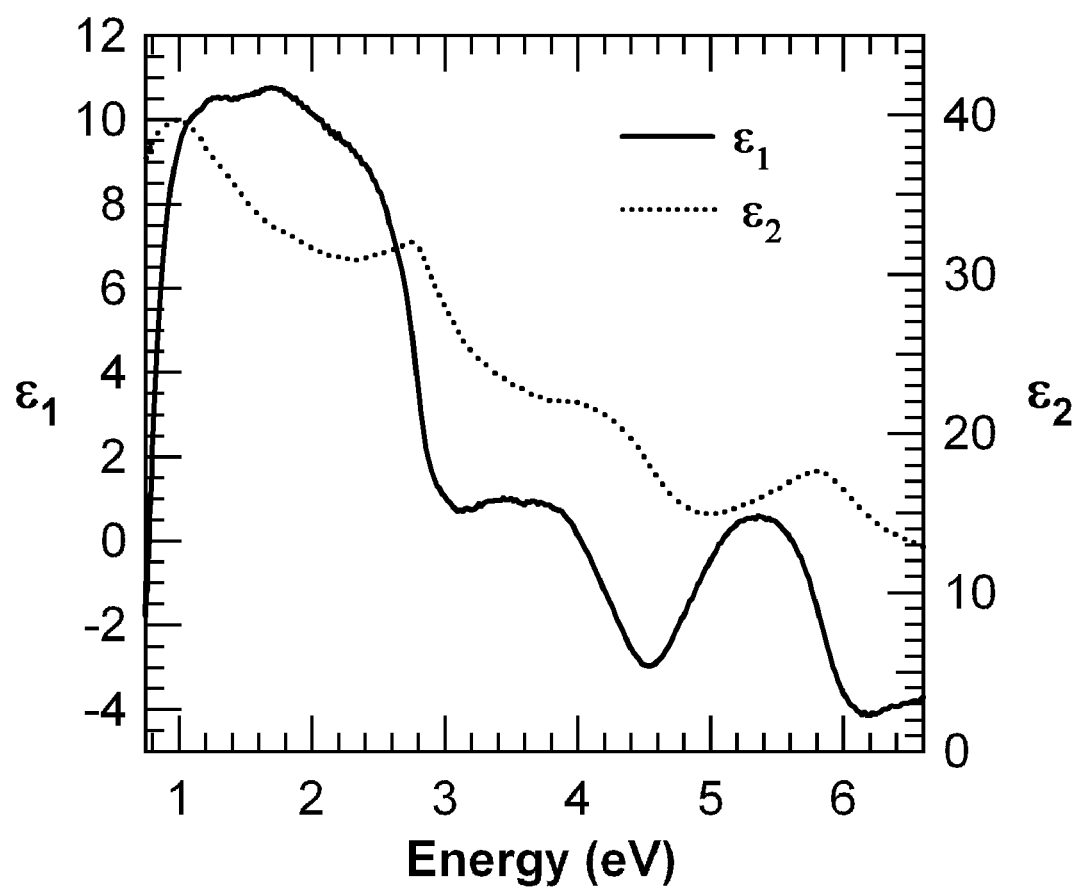
FIG. 19 Real ($\in_1$) and imaginary ($\in_2$) parts of the visible-UV complex dielectric function of a $HfB_2$ films grown on Si(111) via a $Hf_xZr_{1-x}B_2$ buffer layer. The dielectric function is obtained from a point-by-point fit of the ellipsometric data, as described in the text.
Figure 20:
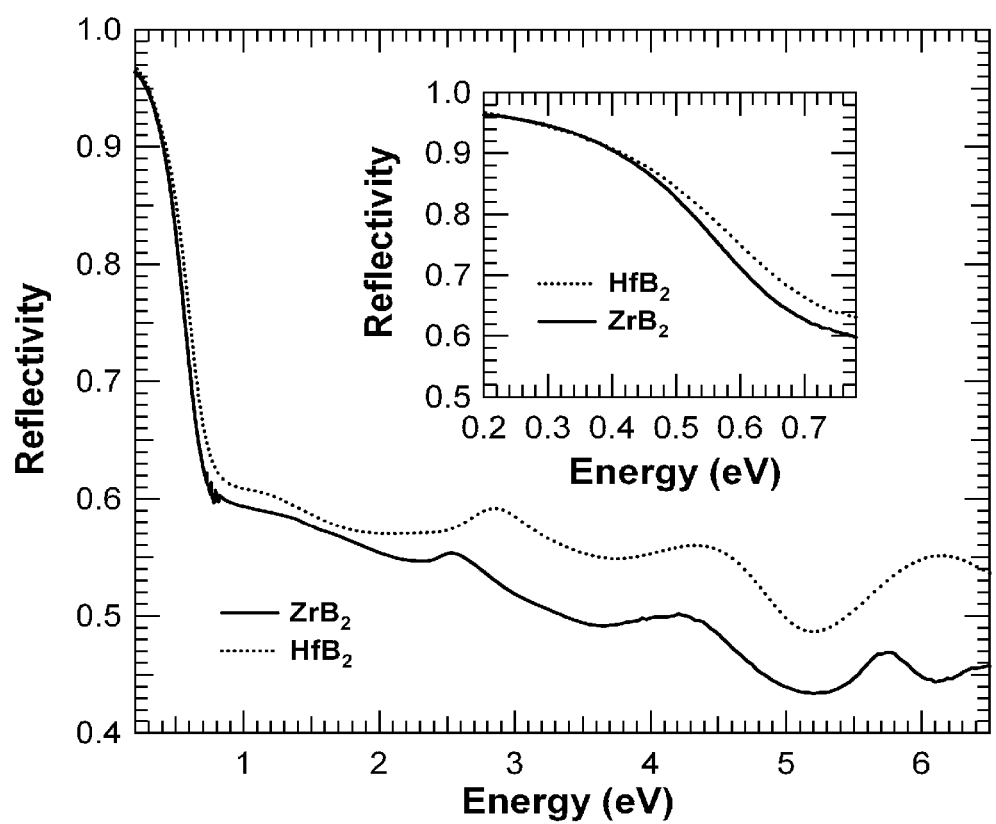
FIG. 20 Solid line: Optical reflectivity of $ZrB_2$ films grown on Si(111), calculated from the dielectric function data. Dotted line: Optical reflectivity of $HfB_2$ films grown on Si(111) via $Hf_xZr_{1-x}B_2$ buffer layers, calculated from the dielectric function data.

Additionally, a sample with an additional $ZrB_2$ cap layer as well as $HfB_2$ layers grown on $Hf_xZr_{1-x}B_2$ buffer layers was studied. Whereas the infrared data from these samples agrees within experimental error, the visible/UV $HfB_2$ dielectric function appears sample-dependent. We show infrared results in FIG. 18 and visible-UV data for a $HfB_2/Hf_xZr_{1-x}B_2/Si$ (111) sample in FIG. 19. The corresponding reflectivities are compared with those of $ZrB_2$ in FIG. 20. The fine structure between 2 eV and 6 eV appears consistently at the same energies in all $HfB_2$ samples, in spite of the somewhat different absolute values of the reflectivity and that these energies are shifted relative to $ZrB_2$. This is consistent with an explanation in terms of interband transitions. Results from a series of $Hf_xZr_{1-x}B_2$ alloy samples, to be presented elsewhere, show that the energies have a smooth compositional dependence between $ZrB_2$ and $HfB_2$.

Analysis of the infrared dielectric function of $HfB_2$ was similar to the $ZrB_2$ study discussed above. The fit of the data includes a Drude term and the fit parameters are $\hbar\omega_p$=4.27 eV and $\tau$=7.5 fs. From these parameters we find $\rho_{dc}$=35.6 μΩcm. The reported room temperature resistivity in bulk $HfB_2$ is $\rho_{dc}$ (298K)=8.8 μΩcm, so that the results were very similar to those obtained from $ZrB_2$ films.

Example 10

Growth on Miscut Si(111) Wafers

While the buffer layer approach described in the preceding examples provides a systematic direct path to significant materials improvement, and yielded key structural and optical data for Hf-rich systems that cannot otherwise be achieved, the presence of residual strains and the need for multistep processing prompted a search for an alternative that would be practical for larger scale integrations schemes.

Figure 21:
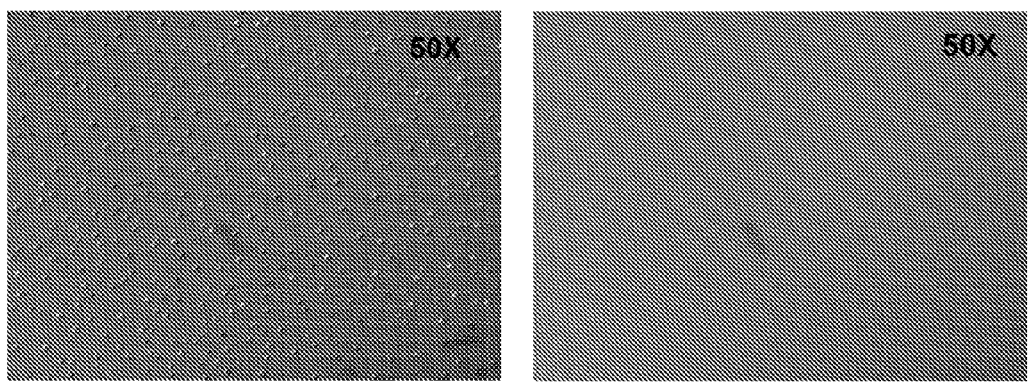
FIG. 21 (Left) Optical image of the surface morphology for a $ZrB_2$ film grown on an on-axis Si(111) wafer showing the presence of large islands. The areas in between islands are smooth with a nominal AFM RMS of ~2.5 nm. (Right) Corresponding image of a film grown on a 4 degree miscut Si(111) showing that the surface is essentially featureless. AFM images indicate a highly homogeneous surface roughness.

It has been unexpectedly found that $Hf_xZr_{1-x}B_2$ films with superior morphological quality can be grown directly on Si wafers that are miscut by ~4 degrees (FIG. 21). This technique allows growth of thick films with a remarkably homogeneous surface roughness suitable for spectroscopic ellipsometry measurements of the dielectric function devoid of artifacts and ambiguities. This is a significant new development which has the potential to produce for the first time large format, Hf-rich hybrid substrates with optimal structural and optical quality.

Example 11

Group III Nitride Growth on Epitaxial Layer GaN/$ZrB_2$/Si (111)

GaN has been epitaxially grown on buffer layers. The layers were grown by chemical vapor deposition (CVD), although other techniques for epitaxial growth of nitrides can also be used In a typical experiment, a Si(111) substrate surface was cleaned by flashing briefly to 1150° C. and 4×10$^{-10}$ Torr. Immediately thereafter a thick $ZrB_2$(0001) buffer layer (100 nm) was grown at 900° C. via decomposing of $Zr(BH_4)_4$. The subsequent growth of GaN was conducted by admitting a single source $H_2GaN_3$ or $D_2GaN_3$ precursor via a nozzle positioned 2 cm away from the substrate surface at a pressure 2×10$^{-7}$ Torr established by the vapor pressure of the compound at room temperature. Films with a nominal 500 nm thickness were produced at 550° C. and were found to display flat surfaces with RMS roughness of ~2 nm and highly aligned microstructures devoid of threading defects within the field of view of the XTEM micrographs. The quality of the materials produced via this method is also reflected in their luminescent properties, which are comparable to those of undoped GaN films grown on sapphire by MOCVD at ~1050° C.

Figure 22:
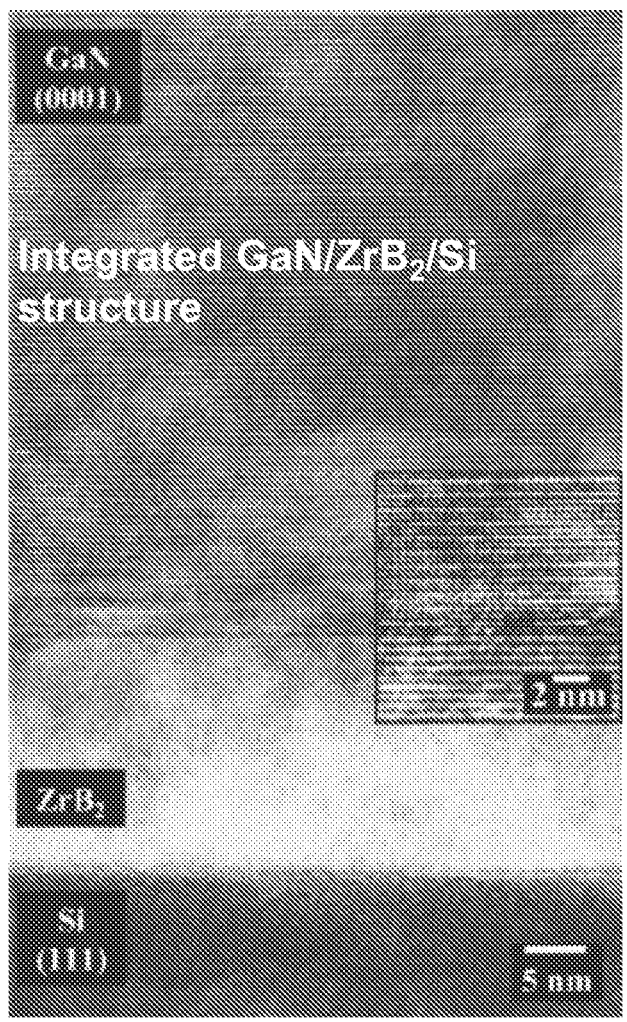
FIG. 22 is a cross-sectional transmission electron microscopy (XTEM) image showing the microstructure of a GaN/$ZrB_2$/Si(111) semiconductor structure according to the invention.
Figure 23:
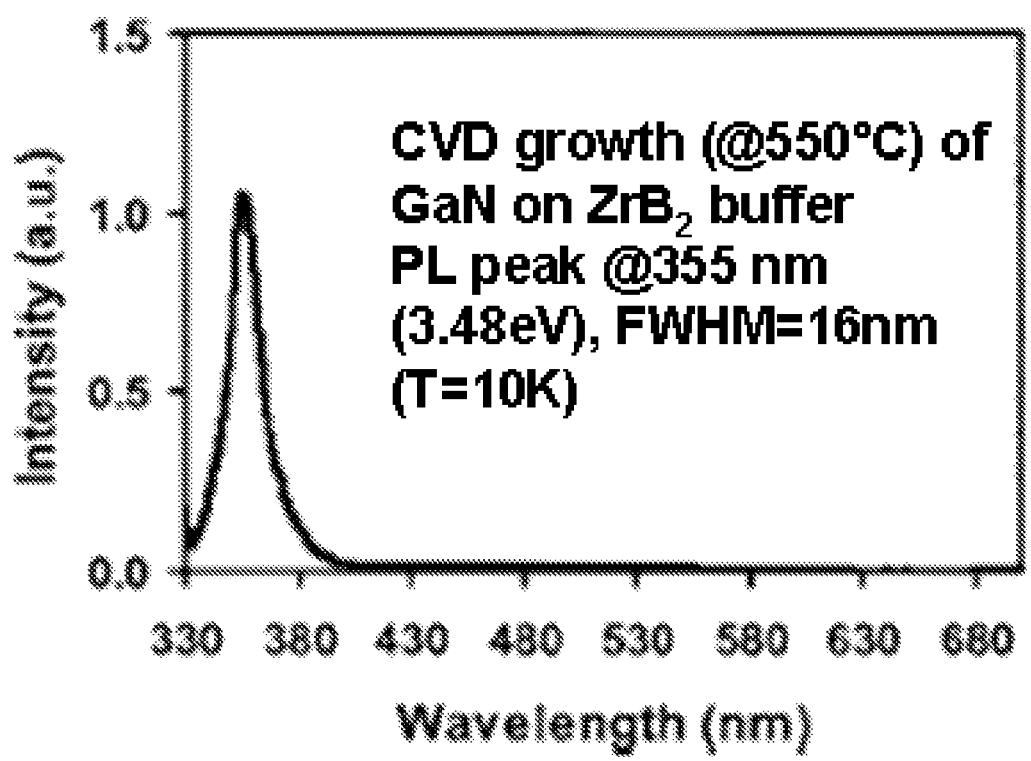
FIG. 23 is a PL spectrum of a GaN/$ZrB_2$/Si(111) semiconductor structure according to the invention.

FIG. 22 shows a cross-sectional transmission electron microscopy (XTEM) image of a GaN/$ZrB_2$/Si(111) semiconductor structure according to the invention. FIG. 23 is a PL spectrum of a GaN/$ZrB_2$/Si(111) semiconductor structure according to the invention. The CVD growth temperature was 550° C., although it will be understood other growth temperatures can also be used. The films exhibit intense photoluminescence (PL) indicative of band-edge emission for a single-phase hexagonal GaN. The PL peak at 10 K is located at 359 nm with a FWHM of 15 nm, close to the neutral donor bound exciton $D^0X$ line at 3.47 eV usually associated with low-temperature PL of GaN films. No yellow luminescence around 560° C. is found for both room temperature and low-temperature PL.

Example 12

Group III Nitride Growth on Epitaxial Layer AlGaN/GaN/$ZrB_2$/Si (111)

An AlGaN overlayer was applied to the structure of Example 11 to form an

AlGaN/GaN/$ZrB_2$/Si(111) heterostructure via thermally activated reactions of $D_2GaN_3$ vapors and elemental Al (99.999% pure) which was evaporated from a Knudsen cell as shown in FIG. 24(a). The reactive flux of the Al atoms at the substrate surface (~1-3 Å/min) was measured using a crystal thickness monitor. The $D_2GaN_3$ vapor was introduced into the chamber through a leak valve at a pressure range of 2-8×10$^{-7}$ Torr. Under these conditions and with the substrate temperature held at 700° C. perfectly homogeneous and monocrystalline alloy films were produced.

The growth rate of the AlGaN layer via this method was ~4 nm per minute to deposit transparent films with nominal thickness of 150 nm. Rutherford backscattering spectrometry (RBS) was used to determine the elemental composition, and estimate the film thickness. The results showed that the Al content in the final product was systematically tuned with in the ~2-10% range by adjusting the flux ratio of the $D_2GaN_3$ and Al gaseous species in the reaction environment. The RBS determined compositions were corroborated by high resolution XRD measurements of the (002) and (004) reflections assuming perfect Vegard's Law behavior in the $Ga_{1-x}Al_xN$ system.

Figure 24:
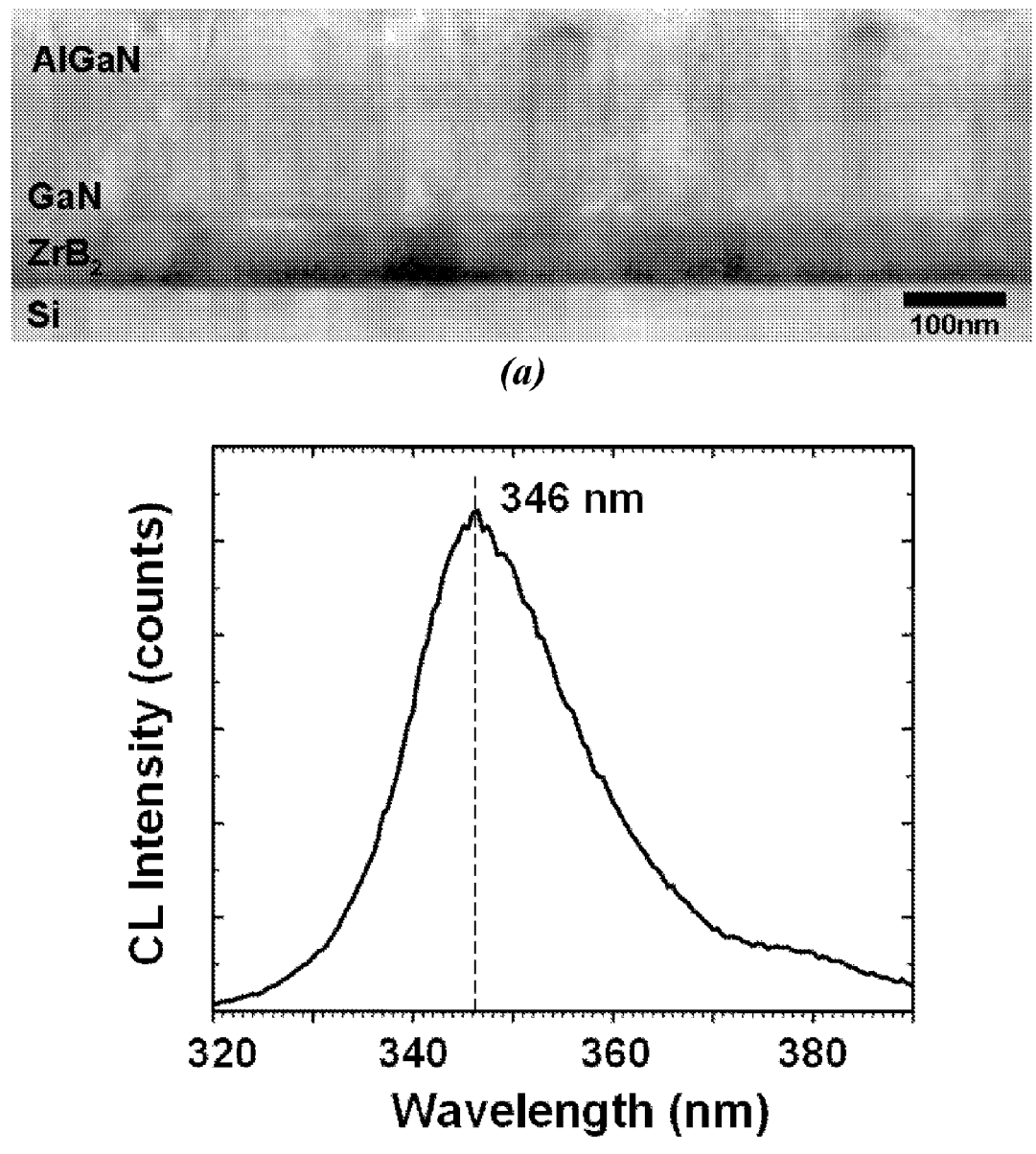
FIG. 24 (a) shows a micrograph illustrating a AlGaN/GaN/$ZrB_2$/Si(111) structure.

Photoemission from a 150 nm thick $Al_{0.08}Ga_{0.92}N$ film was obtained using a cathodoluminescence (CL) spectrometer fitted to a scanning electron microscope. FIG. 24 shows a typical CL spectrum exhibiting strong band gap emission peaks with a wavelength maximum at 346 nm which corresponds to a composition of $Al_{0.10}Ga_{0.90}N$. The peak FWHM is 20 nm is comparable to that of pure GaN grown on $ZrB_2$ via decomposition of $D_2GaN_3$. An additional weak shoulder, likely due to the underlying GaN buffer layer, is observed at 375 nm. The scanning feature of the SEM/CL apparatus was also used to investigate the spatial uniformity and compositional homogeneity of the films by collecting the CL signal at selected wavelengths while rastering across the sample surface. In these experiments three wavelengths were monitored corresponding to the maximum peak value (346 nm), pure GaN (358 nm) and a control value slightly below the alloy maximum (339 nm). It was found that the spatial intensity distributions at these wavelengths are identical indicating a high degree of compositional uniformity in the alloy on a lateral scale of 5 nm.

Example 13

Group III Nitride Growth on Epitaxial Layer AlGaN/GaN/ZrB$_2$/Si (111)

Similar to the preceding example, an AlGaN overlayer was applied to the structure of Example 11 to form an AlGaN/GaN/ZrB$_2$/Si(111) heterostructure. For the present example, the GaN layer adjacent to the substrate was formed at 550-600° C. via a single source deposition of the H$_2$GaN$_3$ compound.

The AlGaN overlayer was formed via reactions of H$_2$GaN$_3$ vapors and a beam of Al atoms generated from a solid source in an effusion cell. This method allowed unprecedented low temperature (600° C.) growth conditions by combining highly energetic single-source CVD with conventional molecular beam epitaxy, Example 14

Theoretical Simulation of the AlGaN/GaN/ZrB$_2$ Growth

The growth of AlGaN on GaN/ZrB$_2$ buffered Si via displacement of Ga atoms from the adsorbed Ga$_3$N$_3$ unit by Al was theoretically studied to elucidate the displacement reaction mechanism leading to the formation of AlGaN. Initially the stability of the (D$_2$GaN$_3$)$_3$ trimeric precursor was investigated and its subsequent interaction with the ZrB$_2$ surface was modeled using first principles density functional theory (DFT). The data indicated that intact Ga$_3$N$_3$ units bind strongly via the N atoms on Zr terminated surfaces and these units serve as reactive sites for subsequent displacement of Ga by Al to form AlGaN.

All of our first principles DFT calculations were performed at the GGA level using the VASP code. A plane wave cutoff of 350 eV and single gamma point k-space integration were used in all cases. A computational cell of dimensions 10.978×12.626×35.3 Å was used to represent the five slab of crystalline ZrB$_2$ with approximately 22 Å of intervening vacuum space. The initial unreacted configuration was represented by placing the (D$_2$GaN$_3$)$_3$ molecule above the slab in the center of the vacuum region. The reacted configurations were initialized by placing the decomposition byproducts D$_2$ and N$_2$ uniformly throughout the same vacuum region and the (GaN)$_3$ building blocks in the vicinity of the surface. Free molecule calculations for the trimeric and monomeric molecular structures were approximated by placing the units within an empty supercell. Computational errors were minimized by using identical conditions (cell dimensions, plane wave cutoffs, convergence criteria) for all calculations.

Calculations indicated that the trimeric (D$_2$GaN$_3$)$_3$ is thermodynamically more stable than the corresponding D$_2$GaN$_3$ monomeric constituents by 4.8 eV. This confirms that the adsorption process and subsequent crystal growth likely involves the entire (GaN)$_3$ molecular core of (D$_2$GaN$_3$)$_3$, and not individual Ga—N units derived from monomers.

The initial steps of the growth process were modeled by simulating the adsorption of (D$_2$GaN$_3$)$_3$ on the free Zr and B-terminated surfaces of a 5 layer ZrB$_2$(0001) slab. The (GaN)$_3$ building block which bonds to the ZrB$_2$ substrate is generated by thermal elimination of the N$_2$ and D$_2$ from gaseous (D$_2$GaN$_3$)$_3$ compound. To simulate this process the net reaction energy was calculated by comparing the energy of an isolated (D$_2$GaN$_3$)$_3$ molecule above the slab, with the energy of the surface bonded (GaN)$_3$ cyclic-core including the D$_2$ and N$_2$ byproduct formation.

In this context, the energies associated with the four possible co-planar (GaN)$_3$—ZrB$_2$(0001) bonding orientations were examined. These include the Ga or N atoms in (GaN)$_3$ bonded to either the free zirconium or boron terminated surface of ZrB$_2$ (0001). The most favorable reaction is found to involve the three N-atoms in (GaN)$_3$ bonded to the Zr-terminated ZrB$_2$ surface. For this case, calculations yielded a net reaction energy of ~−4.5 eV per (GaN)$_3$ unit. This is equivalent to 1.5 eV per Zr—N bond, which is compatible with the calculated Zr—N bond energy of ~1.6 eV found in the corresponding bulk GaN—ZrB$_2$ interface. Results showed that the preformed (GaN)$_3$ building blocks, inherently possess the exact Ga—N composition, the precise bonding configuration and the thermodynamic driving force to form a perfectly commensurate and highly stoichiometric GaN—ZrB$_2$ interface. Any secondary reactions leading to the formation of Zr—B—N at the interface are effectively suppressed via the incorporation of entire (GaN)$_3$ units in to the film.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to claims associated with these embodiments, along with the full scope of equivalents to which such claims are entitled.

We claim:

1. A method for forming an epitaxial buffer layer over a substrate by molecular beam epitaxy comprising:
   contacting a substrate with a precursor gas at a temperature and a pressure suitable for depositing an epitaxial buffer layer over the substrate;
   the epitaxial buffer layer having a thickness of greater than 100 nm and comprising ZrB$_2$, AlB$_2$, HfB$_2$, Hf$_x$Zr$_{1-x}$B$_2$, Hf$_x$Al$_{1-x}$B$_2$, Zr$_x$Al$_{1-x}$B$_2$, or Zr$_z$Hf$_y$Al$_{1-z-y}$B$_2$ wherein the sum of z and y is less than or equal to 1;
   wherein the precursor gas comprises (i) greater than 95% v/v hydrogen gas and (ii) 0.1-5% v/v of a precursor source, wherein the precursor source comprises Zr(BH$_4$)$_4$, Hf(BH$_4$)$_4$, an Al source, or mixtures thereof; and
   wherein the use of the hydrogen gas reduces the surface roughness of the epitaxial layer by acting as a diluent to prevent the poisoning of the surface of the epitaxial layer with B-rich fragments.

2. The method of claim 1 wherein the substrate comprises a miscut Si(111) substrate.

3. The method of claim 1 wherein the temperature ranges from about 850° C. to about 950° C.

4. The method of claim 1 wherein the pressure ranges from about $1 \times 10^{-4}$ Torr to $1 \times 10^{-9}$ Torr.

5. The method of claim 1, wherein the epitaxial buffer layer has a thickness of greater than about 200 nm.

6. The method of claim 1, wherein the epitaxial buffer layer has a thickness of greater than about 400 nm.

7. The method of claim 1, wherein the substrate comprises Si, $Al_2O_3$, SiC or GaAs.

8. The method of claim 7 wherein the substrate comprises Si (100) or Si(111).

9. The method of claim 1, further comprising
forming a Group III nitride layer over the epitaxial buffer layer.

10. The method of claim 9, wherein the epitaxial buffer layer has one or more properties selected from the group consisting of,
(i) thermally decoupled from the substrate;
(ii) a mismatch strain which is essentially thermally constant over a temperature range of room temperature to 900° C.;
(iii) relaxed at 900° C.; and
(iv) an atomically flat surface.

11. The method of claim 9, wherein the Group III nitride layer has one or more properties selected from the group consisting of,
(i) lattice-matched to the epitaxial buffer layer; and
(ii) comprising a compound selected from the group consisting of GaN, AlGaN, InGaN, AlInGaN, AN, InN, SiCAlN, and mixtures thereof.

12. The method of claim 9, wherein the substrate comprises Si, $Al_2O_3$, SiC or GaAs.

13. The method of claim 9 wherein the substrate comprises Si(111) or Si(100).

14. The method of claim 9 wherein the substrate comprises a miscut Si(111) substrate.

15. The method of claim 1, wherein the precursor gas comprises (i) greater than about 98% v/v hydrogen and (ii) about 0.1-2 v/v % of a precursor source.

16. The method of claim 15, wherein the temperature ranges from about 850° C. to about 950° C.

17. The method of claim 16, wherein the epitaxial buffer layer has a thickness of greater than about 200 nm.

18. The method of claim 16, wherein the epitaxial buffer layer has a thickness of greater than about 400 nm.

* * * * *